(12) United States Patent
Wang et al.

(10) Patent No.: US 11,875,727 B2
(45) Date of Patent: Jan. 16, 2024

(54) SHIFT REGISTER, GATE DRIVING CIRCUIT, DISPLAY PANEL, AND DRIVING METHOD THEREOF

(71) Applicant: BOE TECHNOLOGY GROUP CO., LTD., Beijing (CN)

(72) Inventors: Zhen Wang, Beijing (CN); Jian Zhang, Beijing (CN); Jian Sun, Beijing (CN); Wei Yan, Beijing (CN); Deshuai Wang, Beijing (CN); Wenwen Qin, Beijing (CN); Jiguo Wang, Beijing (CN); Han Zhang, Beijing (CN); Yue Shan, Beijing (CN); Xiaoyan Yang, Beijing (CN); Yadong Zhang, Beijing (CN); Shijun Wang, Beijing (CN); Jiantao Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 72 days.

(21) Appl. No.: 17/593,953

(22) PCT Filed: Dec. 22, 2020

(86) PCT No.: PCT/CN2020/138322
§ 371 (c)(1),
(2) Date: Sep. 28, 2021

(87) PCT Pub. No.: WO2022/133729
PCT Pub. Date: Jun. 30, 2022

(65) Prior Publication Data
US 2022/0398968 A1   Dec. 15, 2022

(51) Int. Cl.
*G09G 3/20* (2006.01)
*G09G 3/36* (2006.01)
*G11C 19/28* (2006.01)

(52) U.S. Cl.
CPC ... *G09G 3/2096* (2013.01); *G09G 2310/0283* (2013.01); *G09G 2310/0286* (2013.01); *G09G 2310/08* (2013.01); *G11C 19/28* (2013.01)

(58) Field of Classification Search
CPC .......... G09G 3/2096; G09G 2310/0283–0286; G09G 2310/08; G11C 19/28
See application file for complete search history.

(56) References Cited

U.S. PATENT DOCUMENTS 10,403,220 B2    9/2019    Lv
10,446,104 B2    10/2019   Wang
(Continued)

FOREIGN PATENT DOCUMENTS

CN    105185339 A    12/2015
CN    105938702 A    9/2016
(Continued)

*Primary Examiner* — Lin Li
(74) *Attorney, Agent, or Firm* — Kinney & Lange, P.A.

(57) ABSTRACT

The present disclosure provides a shift register, a gate driving circuit, a display panel, and a driving method thereof. The shift register includes: an input circuit; an output circuit; a first control circuit configured to provide a potential of a first control signal terminal to a pull-down node, and provide a potential of a reference signal terminal to the pull-down node according to the potential of the pull-up node; and a second control circuit connected to the pull-down node, a second control signal terminal, the output signal terminal, and the reference signal terminal, wherein the second control circuit is configured to pull down a potential of the output signal terminal during a display phase under the control of a potential of the pull-down node and a potential of the second control signal terminal, and pull up the potential of the output signal terminal in a power-off phase.

17 Claims, 25 Drawing Sheets

(56) References Cited

U.S. PATENT DOCUMENTS

| | | | |
|---|---|---|---|
| 10,706,947 | B2 | 7/2020 | Zhang et al. |
| 10,916,171 | B2 | 2/2021 | Zhao |
| 10,930,192 | B2 | 2/2021 | Zhao |
| 2011/0025658 | A1 | 2/2011 | Fang et al. |
| 2016/0260402 | A1 | 9/2016 | Otose |
| 2017/0162147 | A1 | 6/2017 | Kim |
| 2017/0316751 | A1 | 11/2017 | Wang |
| 2018/0277052 | A1 | 9/2018 | Miao et al. |
| 2018/0342187 | A1* | 11/2018 | Shan .......................... G09G 3/20 |
| 2018/0350315 | A1* | 12/2018 | Zhang .................. G09G 3/3677 |
| 2019/0019469 | A1 | 1/2019 | Lv |
| 2019/0051365 | A1* | 2/2019 | Li ............................ G09G 3/20 |
| 2019/0073932 | A1* | 3/2019 | Huang ................. G09G 3/3666 |
| 2019/0371422 | A1 | 12/2019 | Wang et al. |
| 2020/0090609 | A1 | 3/2020 | Guan |
| 2020/0258437 | A1 | 8/2020 | Zhao |
| 2020/0302847 | A1 | 9/2020 | Zhao |

FOREIGN PATENT DOCUMENTS

| | | | |
|---|---|---|---|
| CN | 106098011 | A | 11/2016 |
| CN | 106952624 | A | 7/2017 |
| CN | 107358924 | A | 11/2017 |
| CN | 108231032 | A | 6/2018 |
| CN | 108766336 | A | 11/2018 |
| CN | 109427310 | A | 3/2019 |
| CN | 109979370 | A | 7/2019 |
| CN | 110428785 | A | 11/2019 |
| CN | 110992896 | A | 4/2020 |
| EP | 3678124 | A1 | 7/2020 |
| GB | 2570190 | B | 12/2020 |
| TW | 373545 | U | 11/1999 |

* cited by examiner

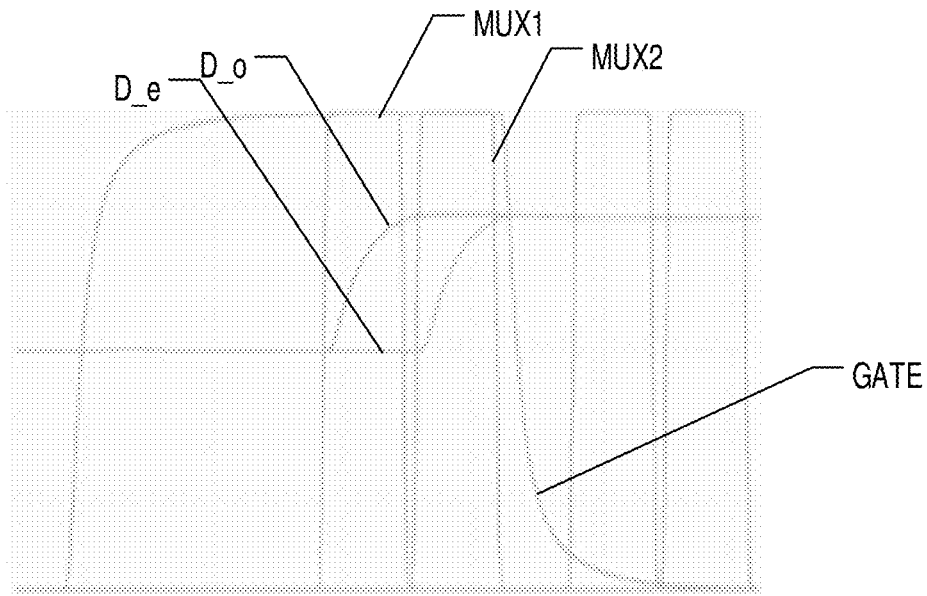

FIG. 23C

| In the display phase, an input signal at a first level is provided to the gate driving circuit, so that each shift register outputs a gate driving signal at the output signal terminal of the shift register based on the input signal under the control of a potential of the input control terminal STV of the shift register | — S2401 |

| In the power-off phase, a second control signal at the first level and an input signal at a second level are provided to the gate driving circuit, so that each shift register provides the second control signal at the first level to the output signal terminal OUT of the shift register, and each shift register provides the input signal at the second level to the pull-up node PU of the shift register under the control of the potential of the input control terminal STV of the shift register | — S2402 |

FIG. 24

SHIFT REGISTER, GATE DRIVING CIRCUIT, DISPLAY PANEL, AND DRIVING METHOD THEREOF

CROSS REFERENCE TO RELATED APPLICATION(S)

This application is a Section 371 National Stage Application of International Application No. PCT/CN2020/138322, filed on Dec. 22, 2020, which is incorporated herein by reference.

TECHNICAL FIELD

The present disclosure relates to a field of a display technology, and in particular to a shift register, a gate driving circuit, a display panel, and a driving method thereof.

BACKGROUND

In a display device, a gate driving circuit is generally used to drive a plurality of sub-pixels for display. For example, when the display device is turned on, the gate driving circuit in the display device is powered on, so that the gate driving circuit generates a gate driving signal. The gate driving signal is provided to a plurality of sub-pixels, so that the sub-pixels are turned on for display. When the display device is turned off, the gate driving circuit is powered off. The gate driving circuit generally includes a plurality of cascaded shift registers so as to generate a plurality of output signals shifted sequentially as the gate driving signal. However, display abnormalities are prone to occur when a gate driving circuit is powered on.

SUMMARY

Embodiments of the present disclosure provide a shift register, including:
  an input circuit connected to an input signal terminal, an input control terminal, and a pull-up node of the shift register, wherein the input circuit is configured to input a potential of the input signal terminal to the pull-up node under the control of a signal of the input control terminal;
  an output circuit connected to the pull-up node, a clock signal terminal, and an output signal terminal, wherein the output circuit is configured to provide a signal of the clock signal terminal to the output signal terminal under the control of a potential of the pull-up node;
  a first control circuit connected to a first control signal terminal, the pull-up node, a pull-down node of the shift register, and a reference signal terminal, wherein the first control circuit is configured to provide a potential of the first control signal terminal to the pull-down node, and provide a potential of the reference signal terminal to the pull-down node according to the potential of the pull-up node; and
  a second control circuit connected to the pull-down node, a second control signal terminal, the output signal terminal, and the reference signal terminal, wherein the second control circuit is configured to pull down a potential of the output signal terminal in a display phase under the control of a potential of the pull-down node and a potential of the second control signal terminal, and pull up the potential of the output signal terminal in a power-off phase.
For example, the second control circuit includes:
  a pull-down sub-circuit connected to the pull-down node, the output signal terminal, and the reference signal terminal, wherein the pull-down sub-circuit is configured to provide the potential of the reference signal terminal to the output signal terminal under the control of the potential of the pull-down node; and
  a lower electronic circuit connected to the second control signal terminal, the pull-down node, the output signal terminal, and the reference signal terminal, wherein the lower electronic circuit is configured to, under the control of a signal of the second control signal terminal, provide the potential of the second control signal terminal to the output signal terminal and provide the potential of the reference signal terminal to the pull-down node.
For example, the lower electronic circuit includes:
  a first transistor having a gate electrode and a first electrode connected to the second control signal terminal, and a second electrode connected to the output signal terminal; and
  a second transistor having a gate electrode connected to the second control signal terminal, a first electrode connected to the reference signal terminal, and a second electrode connected to the pull-down node.
For example, the pull-down sub-circuit includes:
  a third transistor having a gate electrode connected to the pull-down node, a first electrode connected to the reference signal terminal, and a second electrode connected to the output signal terminal; and
  a first capacitor having a first terminal connected to the pull-down node, and a second terminal connected to the reference signal terminal.
For example, the pull-down sub-circuit further includes a fourth transistor having a gate electrode connected to the output signal terminal, a first electrode connected to the reference signal terminal, and a second electrode connected to the pull-down node.
For example, the second control circuit includes:
  a fifth transistor having a gate electrode connected to the pull-down node, a first electrode connected to the second control signal terminal, and a second electrode connected to the output signal terminal; and
  a second capacitor having a first terminal connected to the pull-down node, and a second terminal connected to the reference signal terminal.
For example, the shift register further includes a noise reduction circuit connected to the input control terminal, the pull-down node, and the reference signal terminal, wherein the noise reduction circuit is configured to provide the potential of the reference signal terminal to the pull-down node under the control of the signal of the input control terminal.
For example, the noise reduction circuit includes a sixth transistor having a gate electrode connected to the input control terminal, a first electrode connected to the reference signal terminal, and a second electrode connected to the pull-down node.
For example, the shift register further includes a reset circuit connected to a reset control terminal, a reset signal terminal, and the pull-up node, wherein the reset circuit is configured to provide a potential of the reset signal terminal to the pull-up node under the control of a signal of the reset control terminal.
For example, the pull-up node includes a first pull-up node connected to the input circuit and a second pull-up node connected to the output circuit, and the first control circuit includes:

a seventh transistor having a gate electrode and a first electrode connected to the first control signal terminal, and a second electrode connected to the pull-down node;

an eighth transistor having a gate electrode connected to the pull-down node, a first electrode connected to the reference signal terminal, and a second electrode connected to the first pull-up node;

a ninth transistor having a gate electrode connected to the first pull-up node, a first electrode connected to the reference signal terminal, and a second electrode connected to the pull-down node; and a tenth transistor having a gate electrode connected to a power signal terminal, a first electrode connected to the first pull-up node, and a second electrode connected to the second pull-up node.

For example, the input circuit includes an eleventh transistor having a gate electrode connected to the input control terminal, a first electrode connected to the input signal terminal, and a second electrode connected to the pull-up node.

For example, the output circuit includes:

a twelfth transistor having a gate electrode connected to the pull-up node, a first electrode connected to the clock signal terminal, and a second electrode connected to the output signal terminal; and a third capacitor having a first terminal connected to the pull-up node, and a second terminal connected to the output signal terminal.

For example, the reset circuit includes a thirteenth transistor having a gate electrode connected to the reset control terminal, a first electrode connected to the reset signal terminal, and a second electrode connected to the pull-up node.

For example, the shift register further includes a master reset circuit connected to a master reset signal terminal, the pull-up node, and the reference signal terminal, wherein the master reset circuit is configured to provide the potential of the reference signal terminal to the pull-up node under the control of a signal of the master reset signal terminal.

For example, the master reset circuit includes a fourteenth transistor having a gate electrode connected to the master reset signal terminal, a first electrode connected to the reference signal terminal, and a second electrode connected to the pull-up node.

The embodiments of the present disclosure further provide a gate driving circuit including N-stage cascaded shift registers, wherein each shift register of the N-stage cascaded shift registers is the shift register described above, and wherein, each shift register has an input signal terminal connected to receive an input signal, a reset signal terminal connected to receive a reset signal, and a second control signal terminal connected to receive a second control signal;

an nth stage shift register has an input control terminal connected to an output signal terminal of an (n−i)th stage shift register, and a reset control terminal connected to an output signal terminal of an (n+j)th stage shift register; and the N-stage cascaded shift registers are divided into at least one group, each group of the at least one group includes K-stage cascaded shift registers having clock signal terminals respectively connected to receive K clock signals and first control signal terminals respectively connected to receive the K clock signals, where each of N, K, n, i and j is an integer, $1 \leq n \leq N$, $1 < K \leq N$.

For example, $i=j=4$, $K=8$, the K clock signals include a first clock signal, a second clock signal, a third clock signal, a fourth clock signal, a fifth clock signal, a sixth clock signal, a seventh clock signal and an eighth clock signal, and each group of shift registers includes:

a first stage shift register having a clock signal terminal connected to receive the first clock signal, and a first control signal terminal connected to receive the fifth clock signal;

a second stage shift register having a clock signal terminal connected to receive the second clock signal, and a first control signal terminal connected to receive the sixth clock signal;

a third stage shift register having a clock signal terminal connected to receive the third clock signal, and a first control signal terminal connected to receive the seventh clock signal;

a fourth stage shift register having a clock signal terminal connected to receive the fourth clock signal, and a first control signal terminal connected to receive the eighth clock signal;

a fifth stage shift register having a clock signal terminal connected to receive the fifth clock signal, and a first control signal terminal connected to receive the first clock signal;

a sixth stage shift register having a clock signal terminal connected to receive the sixth clock signal, and a first control signal terminal connected to receive the second clock signal;

a seventh stage shift register having a clock signal terminal connected to receive the seventh clock signal, and a first control signal terminal connected to receive the third clock signal; and an eighth stage shift register having a clock signal terminal connected to receive the eighth clock signal, and a first control signal terminal connected to receive the fourth clock signal.

For example, $i=j=2$, $K=4$, the K clock signals include a first clock signal, a second clock signal, a third clock signal, and a fourth clock signal, and each group of shift registers includes:

a first stage shift register having a clock signal terminal connected to receive the first clock signal, and a first control signal terminal connected to receive the third clock signal;

a second stage shift register having a clock signal terminal connected to receive the second clock signal, and a first control signal terminal connected to receive the fourth clock signal;

a third stage shift register having a clock signal terminal connected to receive the third clock signal, and a first control signal terminal connected to receive the first clock signal; and a fourth stage shift register having a clock signal terminal connected to receive the fourth clock signal, and a first control signal terminal connected to receive the second clock signal.

The embodiments of the present disclosure further provide a display panel, including:

a plurality of sub-pixels arranged in an array; and at least one gate driving circuit described above, wherein the N-stage cascaded shift registers in the gate driving circuit are respectively connected to a plurality of rows of sub-pixels in the array.

For example, the display panel includes two gate driving circuits respectively located on both sides of the array of the plurality of sub-pixels in a first direction, and the first direction is a row direction of the array.

For example, the display panel includes one gate driving circuit, where i=j=2, K=4, and odd-numbered stage shift registers and even-numbered stage shift registers in the gate driving circuit are respectively located on both sides of the array of the plurality of sub-pixels in the first direction.

For example, the display panel includes the shift register includes an input circuit, a first control circuit, a second control circuit, and an output circuit sequentially arranged in the first direction, each of a size of the input circuit in a second direction, a size of the first control circuit in the second direction, a size of the second control circuit in the second direction, and a size of the output circuit in the second direction is 0.8 to 1.4 times a size of the sub-pixel in the second direction, the first direction is a row direction of the array, and the second direction is perpendicular to the first direction.

For example, the display panel further includes a multiplexing circuit connected to M columns of sub-pixels in the array, wherein the multiplexing circuit is configured to multiplex m input data signals received into M output data signals under the control of a first selection signal and a second selection signal and provide the M output data signals to the M columns of sub-pixels respectively, where m is an integer greater than 1, M is an integer greater than 1, and M is an integer multiple of m.

The embodiments of the present disclosure further provide a method of driving the gate driving circuit described above, including:
  in a display phase, providing an input signal at a first level to the gate driving circuit, so that each shift register outputs a gate driving signal at an output signal terminal of the shift register based on the input signal under the control of a potential of an input control terminal of the shift register; and
  in a power-off phase, providing a second control signal at a first level and an input signal at a second level to the gate driving circuit, so that each shift register provides the second control signal at the first level to the output signal terminal of the shift register, and each shift register provides the input signal at the second level to a pull-up node of the shift register under the control of the potential of the input control terminal of the shift register.

For example, the second control circuit of each shift register includes a pull-down sub-circuit and a lower electronic circuit, and wherein,
  in the display phase, the pull-down sub-circuit of each shift register provides a potential of a reference signal terminal of the shift register to an output signal terminal of the shift register under the control of a potential of a pull-down node of the shift register; and
  in the power-off phase, the lower electronic circuit of each shift register provides the second control signal at the first level at the second control signal terminal of the shift register to the output signal terminal of the shift register, and provide the potential of the reference signal terminal of the shift register to the pull-down node of the shift register.

For example, the second control circuit of each shift register includes a fifth transistor and a second capacitor, and the method further includes:
  in the display phase, providing the second control signal at the second level to the gate driving circuit, so that the second control circuit of each shift register provides the second control signal at the second level to the output signal terminal of the shift register under the control of the potential of the pull-down node of the shift register; and
  in the power-off phase, providing K clock signals maintained at the first level to the gate driving circuit, so that the first control circuit of each shift register provides a clock signal at the first level received at the first control signal terminal of the shift register to the pull-down node of the shift register, and a potential of the pull-down node enables the second control circuit of the shift register to provide the second control signal at the first level to the output signal terminal of the shift register.

For example, the method further includes: in the display phase, providing K clock signals shifted sequentially to the gate driving circuit, so that each shift register outputs the gate driving signal at the output signal terminal of the shift register based on the input signal and a received clock signal under the control of the potential of the input control terminal of the shift register, wherein a (k+1)th clock signal is shifted by a unit scanning time with respect to a kth clock signal, where k is an integer, 1≤k≤K−1, and the unit scanning time is a time for scanning a row of pixels by the gate driving circuit.

For example, i=j=4 and K=8 in the gate driving circuit, and in the display phase, the K clock signals are periodic signals with a duty ratio of 25% and a pulse width of 2 times the unit scanning time.

For example, i=j=2 and K=4 in the gate driving circuit, and in the display phase, the K clock signals are periodic signals with a duty ratio of 50% and a pulse width of 2 times the unit scanning time.

For example, i=j=4 and K=8 in the gate driving circuit, and in the display phase, the K clock signals are periodic signals with a duty ratio of 12.5% and a pulse width equal to the unit scanning time.

For example, i=j=2 and K=4 in the gate driving circuit, and in the display phase, the K clock signals are periodic signals with a duty ratio of 25% and a pulse width equal to the unit scanning time.

BRIEF DESCRIPTION OF THE DRAWINGS

FIG. 23A to FIG. 23C show signal simulation diagrams of the embodiment of FIG. 22.

FIG. 24 shows a flowchart of a method of driving a gate driving circuit according to some embodiments of the present disclosure.

DETAILED DESCRIPTION OF EMBODIMENTS

Figure 1:
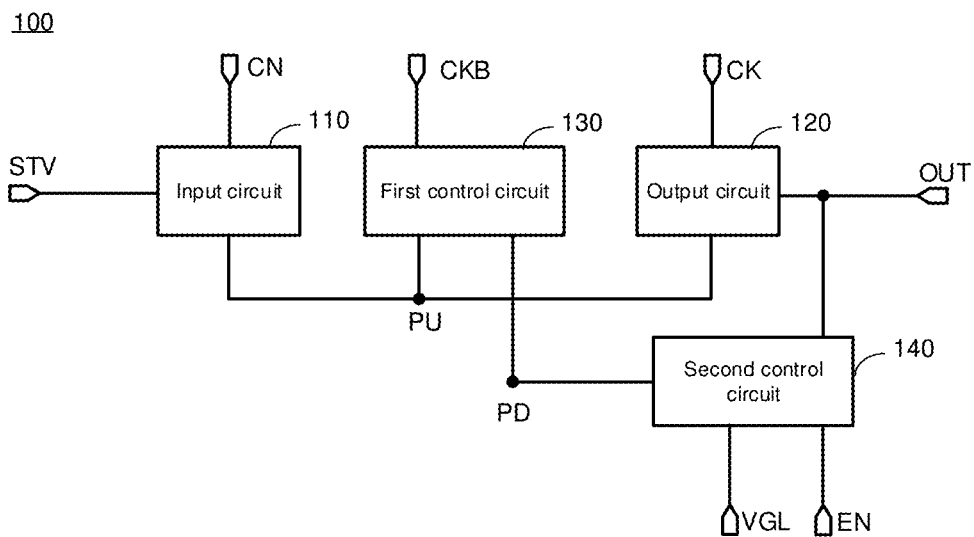
FIG. 1 shows a block diagram of a shift register according to some embodiments of the present disclosure.

In order to make objectives, technical solutions and advantages of the present disclosure clearer, the technical solutions of the present disclosure are clearly and completely described below with reference to the drawings of the embodiments of the present disclosure. Obviously, the embodiments described are only a part but not all of the embodiments of the present disclosure. Based on the embodiments of the present disclosure, all other embodiments obtained by persons of ordinary skill in the art without carrying out inventive effort fall within the protection scope of the present disclosure. It should be noted that throughout the drawings, the same elements are represented by the same or similar reference numerals. In the following description, some specific embodiments are only used for descriptive purposes, and should not be construed as limiting the present disclosure, but merely examples of the embodiments of the present disclosure. When it may cause confusion in the understanding of the present disclosure, conventional structures or configurations will be omitted. It should be noted that the shape and size of each component in the figure do not reflect the actual size and ratio, but merely illustrate the content of the embodiment of the present disclosure.

Unless otherwise defined, the technical or scientific terms used in the embodiments of the present disclosure should have the usual meanings understood by those skilled in the art. The words "first," "second," and the like used in the embodiments of the present disclosure do not indicate any order, quantity or importance, but are only used to distinguish different composition parts.

In addition, in the description of the embodiments of the present disclosure, the term "connected" or "coupled" may mean that two components are directly connected, or that two components are connected via one or more other components. In addition, these two components may be connected or coupled by wired or wireless means.

In addition, in the description of the embodiments of the present disclosure, the terms "first level" and "second level" are only used to distinguish a difference in amplitude of two levels. For example, in the following description, the "first level" being a high level and the "second level" being a low level are illustrated by way of example. Those skilled in the art may understand that the present disclosure is not limited thereto.

Transistors used in the embodiments of the present disclosure may all be thin film transistors or field effect transistors or other devices with the same characteristics. Preferably, the thin film transistor used in the embodiments of the present disclosure may be an oxide semiconductor transistor or a low temperature poly-silicon (LTPS) thin film transistor. Since source and drain electrodes of the thin film transistor used here are symmetrical, the source and drain electrodes may be interchanged. In the embodiments of the present disclosure, one of the source electrode and the drain electrode is called a first electrode, and the other is called a second electrode. In the following examples, an N-type thin film transistor is illustrated by way of example. Those skilled in the art may understand that the embodiments of the present disclosure may obviously be applied to a case of P-type thin film transistors.

FIG. 1 shows a block diagram of a shift register according to some embodiments of the present disclosure.

As shown in FIG. 1, a shift register 100 includes an input circuit 110, an output circuit 120, a first control circuit 130, and a second control circuit 140.

The input circuit 110 is connected to an input signal terminal CN, an input control terminal STV, and a pull-up node PU. The input circuit 110 may input a potential of the input signal terminal CN to the pull-up node PU under the control of a signal of the input control terminal STV.

The output circuit 120 is connected to the pull-up node PU, a clock signal terminal CK, and an output signal terminal OUT. The output circuit 120 may provide a signal of the clock signal terminal CK to the output signal terminal OUT under the control of a potential of the pull-up node PU.

The first control circuit 130 is connected to a first control signal terminal CKB, the pull-up node PU, a pull-down node PD, and a reference signal terminal VGL. The first control circuit 130 may provide a potential of the first control signal terminal CKB to the pull-down node PD, and provide a potential of the reference signal terminal VGL to the pull-down node PD according to the potential of the pull-up node PU.

The second control circuit 140 is connected to the pull-down node PD, a second control signal terminal EN, the output signal terminal OUT, and the reference signal terminal VGL. The second control circuit 140 may pull down a potential of the output signal terminal OUT in a display phase and pull up the potential of the output signal terminal OUT in a power-off phase under the control of a potential of the pull-down node PD and a potential of the second control signal terminal EN.

Generally, during a power-off process of the shift register, all signal terminals (such as the input control terminal, the input signal terminal, the first control signal terminal, the clock signal terminal, the reference signal terminal, etc.) are placed at an active level (such as a high level), so that a high level is output at the output signal terminal, and a charge release is achieved.

In the embodiments of the present disclosure, by providing the second control circuit connected to a separate second control signal terminal, a pull-up and a pull-down of the potential of the output signal terminal may be controlled based on the signal of the second control signal terminal, so that the charge release may be achieved without placing all signal terminals at an active level (for example, a high level) when the shift register is powered off. Since it is not necessary to place all signal terminals at an active level during the power-off, the level of the pull-up node may be set as needed in the power-off phase. For example, the pull-up node may be set to an inactive level (for example, a low level), so as to avoid a case that when the shift register is powered on again, an undesired output is generated in the power-on phase because a reset of the pull-up node is not supported in the power-on process.

Figure 2A:
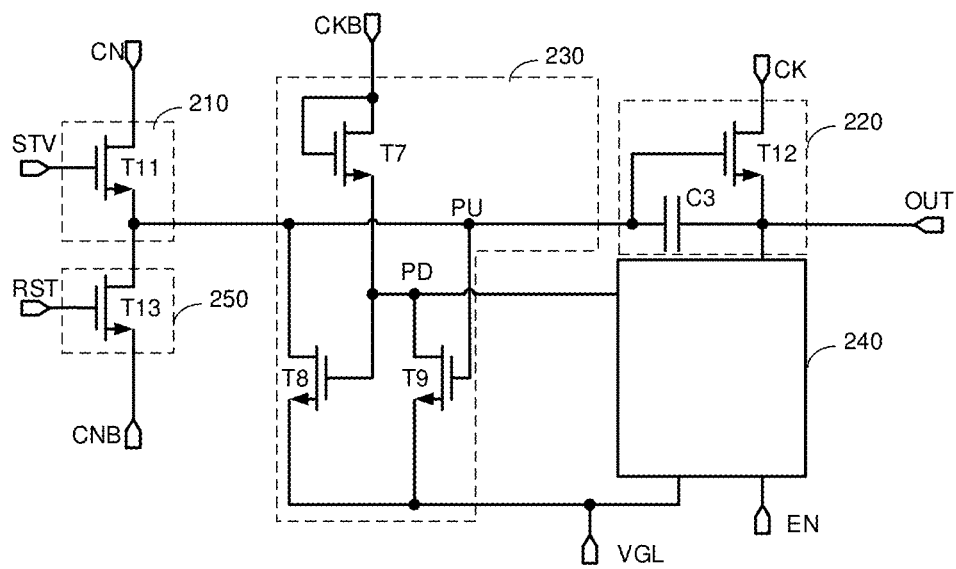
FIG. 2A shows a circuit diagram of a shift register according to an embodiment of the present disclosure.

FIG. 2A shows a circuit diagram of a shift register according to an embodiment of the present disclosure.

As shown in FIG. 2A, a shift register 200A includes an input circuit 210, an output circuit 220, a first control circuit 230, and a second control circuit 240. The above descriptions for the input circuit 110, the output circuit 120, the first control circuit 130 and the second control circuit 140 are also applicable to the input circuit 210, the output circuit 220, the first control circuit 230 and the second control circuit 240, respectively.

The input circuit 210 may include an eleventh transistor T11 having a gate electrode connected to the input control terminal STV, a first electrode connected to the input signal terminal CN, and a second electrode connected to the pull-up node PU.

The output circuit 220 may include a twelfth transistor T12 and a third capacitor C3. The twelfth transistor T12 has a gate electrode connected to the pull-up node PU, a first electrode connected to the clock signal terminal CK, and a second electrode connected to the output signal terminal OUT. The third capacitor C3 has a first terminal connected to the pull-up node PU, and a second terminal connected to the output signal terminal OUT.

The first control circuit 230 may include a seventh transistor T7, an eighth transistor T8, and a ninth transistor T9. The seventh transistor T7 has a gate electrode and a first electrode connected to the first control signal terminal CKB, and a second electrode connected to the pull-down node PD. The eighth transistor T8 has a gate electrode connected to the pull-down node PD, a first electrode connected to the reference signal terminal VLG, and a second electrode connected to the pull-up node PU. The ninth transistor T9 has a gate electrode connected to the pull-up node PU, a first electrode connected to the reference signal terminal VGL, and a second electrode connected to the pull-down node PD.

As shown in FIG. 2A, the shift register 200A may further include a reset circuit 250. The reset circuit 250 may include a thirteenth transistor T13 having a gate electrode connected to a reset control terminal RST, a first electrode connected to a reset signal terminal CNB, and a second electrode connected to the pull-up node PU. The reset circuit 250 and the input circuit 210 may be used interchangeably to achieve a forward scanning and a backward scanning. For example, in a case of the forward scanning, a high-level signal is applied to the input signal terminal CN, and a low-level signal is applied to the reset signal terminal CNB. The input circuit 210 may provide a high-level input to the pull-up node PU based on a high level of the input signal terminal CN, and the reset circuit 250 may reset the pull-up node PU to a low level based on a low level of the reset signal terminal CNB. In a case of the backward scanning, a low-level signal is applied to the input signal terminal CN, and a high-level signal is applied to the reset signal terminal CNB. The reset circuit 250 may provide a high-level input to the pull-up node PU based on a high level of the reset signal terminal CNB, and the input circuit 210 may reset the pull-up node PU to a low level based on a low level of the input signal terminal CN.

Figure 2B:
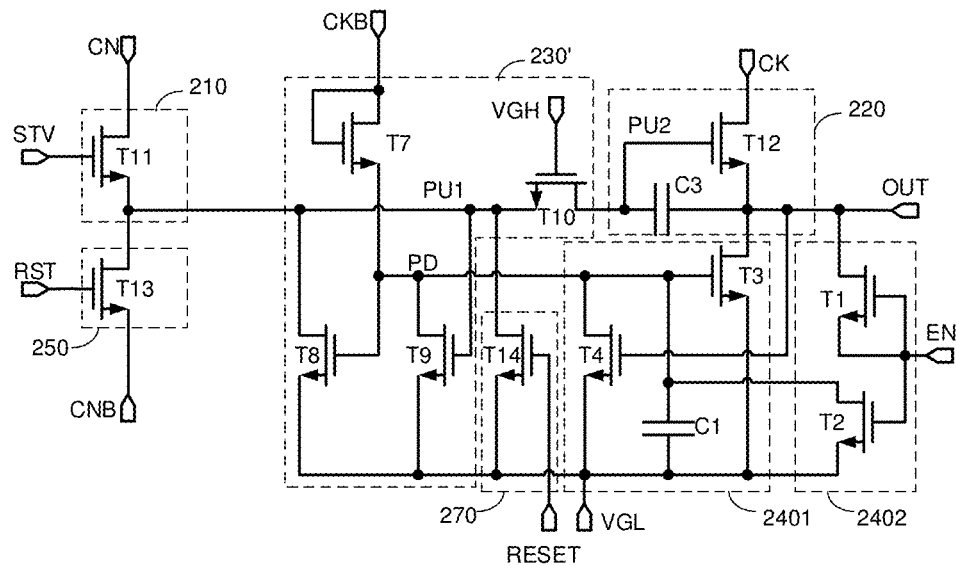
FIG. 2B shows a circuit diagram of a shift register according to another embodiment of the present disclosure.

FIG. 2B shows a circuit diagram of a shift register according to another embodiment of the present disclosure. A shift register 200B of FIG. 2B is similar to the shift register 200A described above. For the sake of conciseness, the following will mainly describe different parts in detail.

Similar to the shift register 200A, the shift register 200B includes an input circuit 210, an output circuit 220, a first control circuit 230', and a reset circuit 250. Different from the shift register 200A of FIG. 2A, the shift register 200B has two pull-up nodes, including a first pull-up node PU1 and a second pull-up node PU2. The first pull-up node PU1 is connected to the input circuit 210, and the second pull-up node PU2 is connected to the output circuit 220. In addition to the seventh transistor T7, the eighth transistor T8 and the ninth transistor T9, the first control circuit 230' may further include a tenth transistor T10 connected between the first pull-up node PU1 and the second pull-up node PU2. As shown in FIG. 2B, the tenth transistor T10 has a gate electrode connected to a power signal terminal VGH, a first electrode connected to the first pull-up node PU1, and a second electrode connected to the second pull-up node PU2. The seventh transistor T7 has a gate electrode and a first electrode connected to the first control signal terminal CKB, and a second electrode connected to the pull-down node PD. The eighth transistor T8 has a gate electrode connected to the pull-down node PD, a first electrode connected to the reference signal terminal VLG, and a second electrode connected to the first pull-up node PU1. The ninth transistor T9 has a gate electrode connected to the first pull-up node PU1, a first electrode connected to the reference signal terminal VGL, and a second electrode connected to the pull-down node PD. When the power signal terminal VGH is at a high level, the tenth transistor T10 is turned on, so as to electrically connect the first pull-up node PU1 and the second pull-up node PU2. When the power signal terminal VGH is at a low level, the tenth transistor T10 is turned off, so as to electrically isolate the first pull-up node PU1 and the second pull-up node PU2. By providing the tenth transistor T10, the first pull-up node PU1 and the second pull-up node PU2 may be electrically isolated or electrically connected as needed, so as to prevent a potential of the second pull-up node PU2 for controlling the output circuit 320 from being affected by other circuits when necessary.

In the shift register 200B of FIG. 2B, the second control circuit may include a pull-down sub-circuit 2401 and a lower electronic circuit 2402.

The pull-down sub-circuit 2401 is connected to the pull-down node PD, the output signal terminal OUT, and the reference signal terminal VGL. The pull-down sub-circuit 2401 may provide the potential of the reference signal terminal VGL to the output signal terminal OUT under the control of the potential of the pull-down node PD. As shown in FIG. 2B, the pull-down sub-circuit 2401 may include a third transistor T3 and a first capacitor C1. The third transistor T3 has a gate electrode connected to the pull-down node PD, a first electrode connected to the reference signal terminal VGL, and a second electrode connected to the output signal terminal OUT. The first capacitor C1 has a first terminal connected to the pull-down node PD, and a second terminal connected to the reference signal terminal VGL.

The lower electronic circuit 2402 is connected to the second control signal terminal EN, the pull-down node PD, the output signal terminal OUT, and the reference signal terminal VGL. The lower electronic circuit 2402 may provide the potential of the second control signal terminal EN to the output signal terminal OUT and provide the potential of the reference signal terminal VGL to the pull-down node PD under the control of the signal of the second control signal terminal EN. As shown in FIG. 2B, the lower electronic circuit 2402 may include a first transistor T1 and a second transistor T2. The first transistor T1 has a gate electrode and a first electrode connected to the second control signal terminal EN, and a second electrode connected to the output signal terminal OUT. The second transistor T2 has a gate electrode connected to the second control signal terminal EN, a first electrode connected to the reference signal terminal VGL, and a second electrode connected to the pull-down node PD.

In some embodiments, as shown in FIG. 2B, the pull-down sub-circuit 2401 may further include a fourth transistor T4 having a gate electrode connected to the output signal terminal OUT, a first electrode connected to the reference signal terminal VGL, and a second electrode connected to the pull-down node PD. When the output signal terminal OUT is at a high level, the fourth transistor T4 is turned on, so as to pull down the pull-down node PD to the low level of the reference signal terminal VGL. The fourth transistor T4 achieves a function of further stabilizing the potential of the pull-down node PD.

In some embodiments, as shown in FIG. 2B, the shift register 200B may further include a master reset circuit 270. The master reset circuit 270 is connected to a master reset signal terminal RESET, the first pull-up node PU1, and the reference signal terminal VGL. The master reset circuit 370 may provide the potential of the reference signal terminal VGL to the first pull-up node PU1 under the control of a signal of the master reset signal terminal RESET. As shown in FIG. 2B, the master reset circuit 270 may include a fourteenth transistor T14 having a gate electrode connected to the master reset signal terminal RESET, a first electrode connected to the reference signal terminal VGL, and a second electrode connected to the first pull-up node PUL. When the master reset signal terminal RESET is at a high level, the fourteenth transistor T14 is turned on, so as to reset the first pull-up node PU1 to the low level at the reference signal terminal VGL.

Figure 2C:
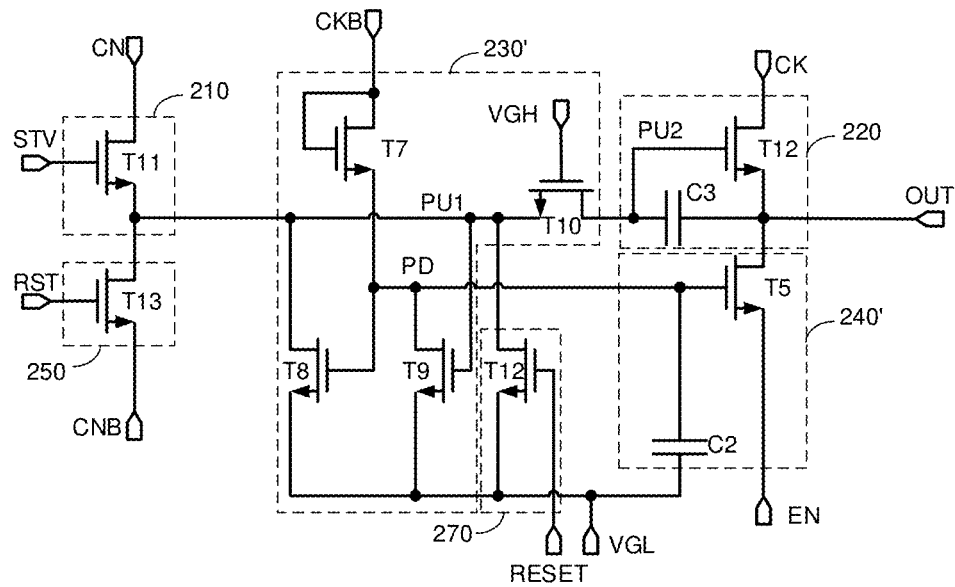
FIG. 2C shows a circuit diagram of a shift register according to another embodiment of the present disclosure.

FIG. 2C shows a circuit diagram of a shift register according to another embodiment of the present disclosure. Similar to the shift register 200B, a shift register 200C includes an input circuit 210, an output circuit 220, a first control circuit 230', a reset circuit 250, and a master reset circuit 270.

Different from the shift register 200B, the second control circuit 240' of the shift register 200C may include a fifth transistor T5 and a second capacitor C2. The fifth transistor T5 has a gate electrode connected to the pull-down node PD, a first electrode connected to the second control signal terminal EN, and a second electrode connected to the output signal terminal OUT. The second capacitor C2 has a first terminal connected to the pull-down node PD, and a second terminal connected to the reference signal terminal VGL.

Figure 2D:
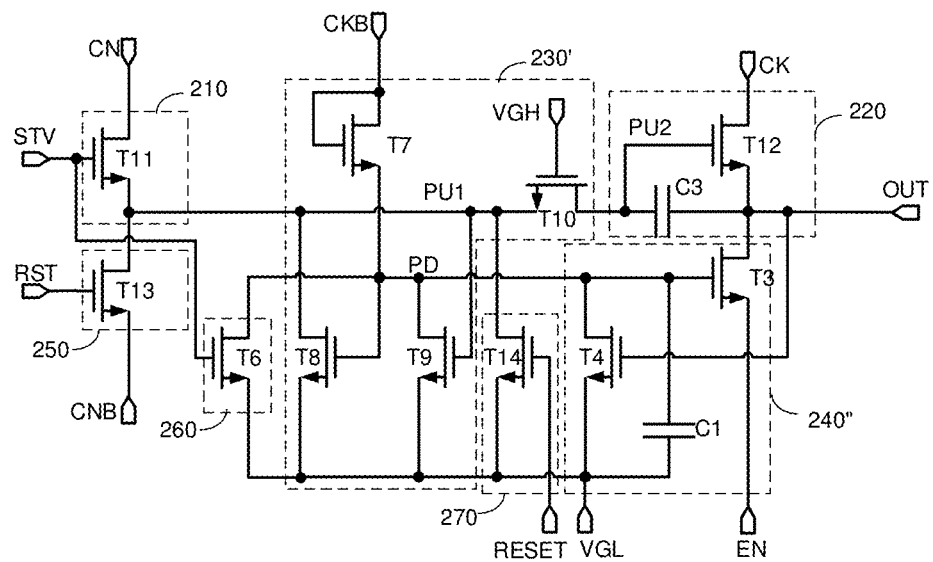
FIG. 2D shows a circuit diagram of a shift register according to another embodiment of the present disclosure.

FIG. 2D shows a circuit diagram of a shift register according to another embodiment of the present disclosure. A shift register 200D of FIG. 2D is similar to the shift register 200B, and a difference lies at least in a structure of a second control circuit 240" and further including a noise reduction circuit 260.

As shown in FIG. 2D, the noise reduction circuit 260 is connected to the input control terminal STV, the pull-down node PD, and the reference signal terminal VGL. The noise reduction circuit 260 may provide the potential of the reference signal terminal VGL to the pull-down node PD under the control of the signal of the input control terminal STV. As shown in FIG. 2, the noise reduction circuit 260 may include a sixth transistor T6 having a gate electrode connected to the input control terminal STV, a first electrode connected to the reference signal terminal VGL, and a second electrode connected to the pull-down node PD.

As shown in FIG. 2D, the second control circuit 240" may include a third transistor T3, a fourth transistor T4, and a first capacitor C1. The third transistor T3 has a gate electrode connected to the pull-down node PD, a first electrode connected to the second control signal terminal EN, and a second electrode connected to the output signal terminal OUT. The first capacitor C1 has a first terminal connected to the pull-down node PD, and a second terminal connected to the reference signal terminal VGL. The fourth transistor T4 has a gate electrode connected to the output signal terminal OUT, a first electrode connected to the reference signal terminal VGL, and a second electrode connected to the pull-down node PD. Certainly, the embodiments of the present disclosure are not limited to this. In some embodiments, the first electrode of the third transistor T3 may be connected to the reference signal terminal VGL instead of the second control signal terminal EN.

Figure 3:
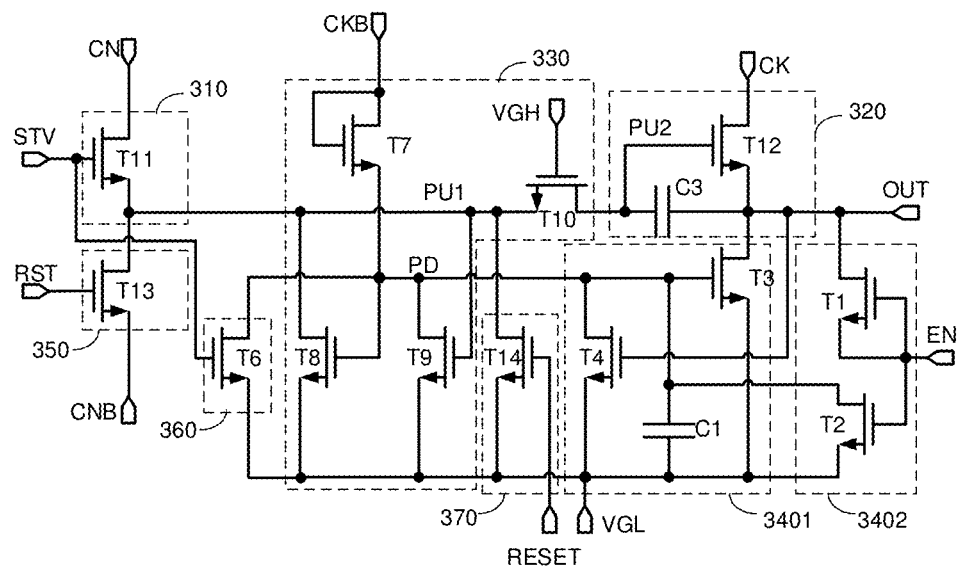
FIG. 3 shows a circuit diagram of a shift register according to another embodiment of the present disclosure.

FIG. 3 shows a circuit diagram of a shift register according to another embodiment of the present disclosure. A shift register 300 of FIG. 3 is similar to the shift register 200A described above. For the sake of conciseness, the following will mainly describe different parts in detail.

Similar to the shift register 200A, the shift register 300 may include an input circuit 310, an output circuit 320, a first control circuit 330, and a reset circuit 350. The above descriptions for the input circuit 210, the output circuit 220, the first control circuit 230 and the reset circuit 250 are also applicable to the input circuit 310, the output circuit 320, the first control circuit 330 and the reset circuit 350.

Different from the shift register 200A of FIG. 2A, the shift register 300 has two pull-up nodes, including a first pull-up node PU1 and a second pull-up node PU2. The first pull-up node PU1 is connected to the input circuit 310, and the second pull-up node PU2 is connected to the output circuit 320. In addition to the seventh transistor T7, the eighth transistor T8 and the ninth transistor T9, the first control circuit may further include a tenth transistor T10 connected between the first pull-up node PU1 and the second pull-up node PU2. As shown in FIG. 3, the tenth transistor T10 has a gate electrode connected to a power signal terminal VGH, a first electrode connected to the first pull-up node PU1, and a second electrode connected to the second pull-up node PU2. The seventh transistor T7 has a gate electrode and a first electrode connected to the first control signal terminal CKB, and a second electrode connected to the pull-down node PD. The eighth transistor T8 has a gate electrode connected to the pull-down node PD, a first electrode connected to the reference signal terminal VLG, and a second electrode connected to the first pull-up node PU1. The ninth transistor T9 has a gate electrode connected to the first pull-up node PU1, a first electrode connected to the reference signal terminal VGL, and a second electrode connected to the pull-down node PD. When the power signal terminal VGH is at a high level, the tenth transistor T10 is turned on, so as to electrically connect the first pull-up node PU1 and the second pull-up node PU2. When the power signal terminal VGH is at a low level, the tenth transistor T10 is turned off, so as to electrically isolate the first pull-up node PU1 and the second pull-up node PU2. By providing the tenth transistor T10, the first pull-up node PU1 and the second pull-up node PU2 may be electrically isolated or electrically connected as needed, so as to prevent a potential of the second pull-up node PU2 for controlling the output circuit 320 from being affected by other circuits when necessary.

As shown in FIG. 3, the second control circuit may include a pull-down sub-circuit 3401 and a lower electronic circuit 3402.

The pull-down sub-circuit 3401 is connected to the pull-down node PD, the output signal terminal OUT, and the reference signal terminal VGL. The pull-down sub-circuit 3401 may provide the potential of the reference signal terminal VGL to the output signal terminal OUT under the control of the potential of the pull-down node PD. As shown in FIG. 3, the pull-down sub-circuit 3401 may include a third transistor T3 and a first capacitor C1. The third transistor T3 has a gate electrode connected to the pull-down node PD, a first electrode connected to the reference signal terminal VGL, and a second electrode connected to the output signal terminal OUT. The first capacitor C1 has a first terminal connected to the pull-down node PD, and a second terminal connected to the reference signal terminal VGL.

The lower electronic circuit 3402 is connected to the second control signal terminal EN, the pull-down node PD, the output signal terminal OUT, and the reference signal terminal VGL. The lower electronic circuit 3402 may provide the potential of the second control signal terminal EN to the output signal terminal OUT and provide the potential of the reference signal terminal VGL to the pull-down node PD under the control of the signal of the second control signal terminal EN. As shown in FIG. 3, the lower electronic circuit 3402 may include a first transistor T1 and a second transistor T2. The first transistor T1 has a gate electrode and a first electrode connected to the second control signal terminal EN, and a second electrode connected to the output signal terminal OUT. The second transistor T2 has a gate electrode connected to the second control signal terminal EN, a first electrode connected to the reference signal terminal VGL, and a second electrode connected to the pull-down node PD.

In some embodiments, as shown in FIG. 3, the pull-down sub-circuit 3401 may further include a fourth transistor T4 having a gate electrode connected to the output signal terminal OUT, a first electrode connected to the reference signal terminal VGL, and a second electrode connected to the pull-down node PD. When the output signal terminal OUT is at a high level, the fourth transistor T4 is turned on, so as to pull down the pull-down node PD to the low level of the reference signal terminal VGL. The fourth transistor T4 achieves the function of further stabilizing the potential of the pull-down node PD.

In some embodiments, as shown in FIG. 3, the shift register may further include a noise reduction circuit 360. The noise reduction circuit 360 is connected to the input control terminal STV, the pull-down node PD, and the reference signal terminal VGL. The noise reduction circuit 360 may provide the potential of the reference signal terminal VGL to the pull-down node PD under the control of the signal of the input control terminal STV. As shown in FIG. 3, the noise reduction circuit 260 may include a sixth transistor T6 having a gate electrode connected to the input control terminal STV, a first electrode connected to the reference signal terminal VGL, and a second electrode connected to the pull-down node PD.

Without the noise reduction circuit 360, when the input control terminal STV is at a high level, the eleventh transistor T11 is turned on, and the high level at the input signal terminal CN is input to the first pull-up node PU1, so that the ninth transistor T9 is turned on. During this period, the high level at the first control signal terminal CKB may turn on the seventh transistor T7, so that a direct current path is formed between the seventh transistor T7 and the ninth transistor T9. Since a channel width-to-length ratio W/L of the ninth transistor T9 is at least twice that of the seventh transistor, a resistance of the seventh transistor T7 is greater than that of the ninth transistor T9, and the pull-down node PD is at an intermediate level under the action of a resistance division. The intermediate level is close to but greater than the low level at the reference signal terminal VGL. The intermediate level at the pull-down node PD may turn on the eighth transistor T8, so as to pull down the potential of the first pull-up node PU1.

By providing the noise reduction circuit 360, when the input control terminal STV is at a high level, the sixth transistor T6 is turned on, so as to further pull down the potential of the pull-down node PD by using the low level of the reference signal terminal VGL. In this way, the above problem that the potential of the first pull-up node PU1 is affected because the potential of the pull-down node PD is not low enough may be mitigated or avoided, and a competitive relationship between the pull-up node PU and the pull-down node PD may be improved.

In some embodiments, as shown in FIG. 3, the shift register 300 may further include a master reset circuit 370. The master reset circuit 370 is connected to a master reset signal terminal RESET, the first pull-up node PU1, and the reference signal terminal VGL. The master reset circuit 370 may provide the potential of the reference signal terminal VGL to the first pull-up node PU1 under the control of a signal of the master reset signal terminal RESET. As shown in FIG. 3, the master reset circuit 370 may include a fourteenth transistor T14 having a gate electrode connected to the master reset signal terminal RESET, a first electrode connected to the reference signal terminal VGL, and a second electrode connected to the first pull-up node PU1. When the master reset signal terminal RESET is at a high level, the fourteenth transistor T14 is turned on, so as to reset the first pull-up node PU1 to the low level at the reference signal terminal VGL.

Figure 4:
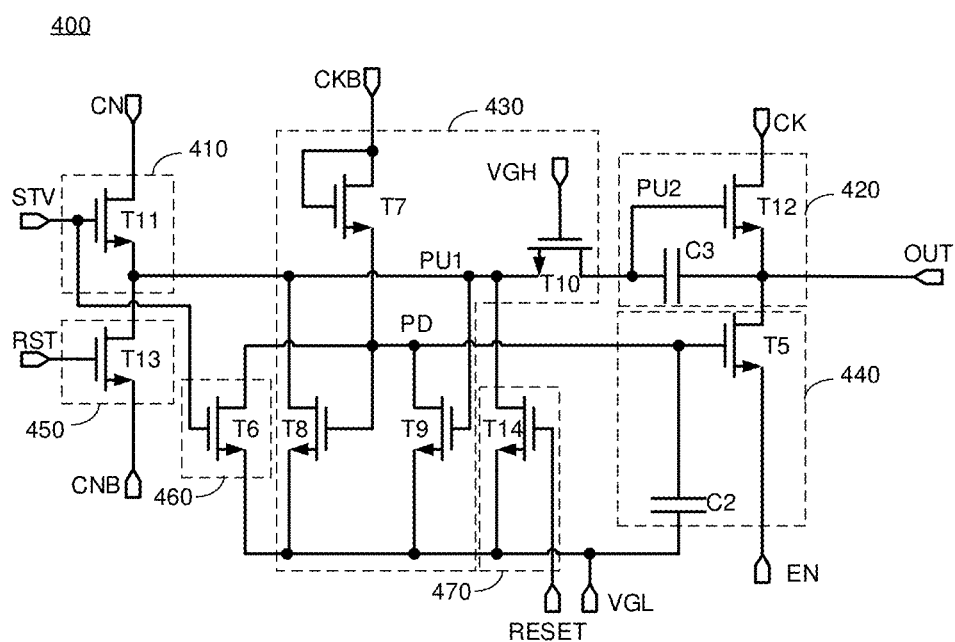
FIG. 4 shows a circuit diagram of a shift register according to another embodiment of the present disclosure.

FIG. 4 shows a circuit diagram of a shift register according to another embodiment of the present disclosure. A shift register 400 of FIG. 4 is similar to the shift register 300 of FIG. 3, and a difference lies at least in the second control circuit 440. For the sake of conciseness, the following will mainly describe different parts in detail.

Similar to the shift register 300, the shift register 400 may include an input circuit 410, an output circuit 420, a first control circuit 430, a reset circuit 450, a noise reduction circuit 460, and a master reset circuit 470. The above descriptions for the input circuit 310, the output circuit 320, the first control circuit 330, the reset circuit 350, the noise reduction circuit 360 and the master reset circuit 370 are also applicable to the input circuit 410, the output circuit 420, the first control circuit 430, the reset circuit 450, the noise reduction circuit 460 and the master reset circuit 470.

Different from the shift register 300, the second control circuit 440 of the shift register 400 may include a fifth transistor T5 and a second capacitor C2. The fifth transistor T5 has a gate electrode connected to the pull-down node PD, a first electrode connected to the second control signal terminal EN, and a second electrode connected to the output signal terminal OUT. The second capacitor C2 has a first terminal connected to the pull-down node PD, and a second terminal connected to the reference signal terminal VGL.

Figure 5:
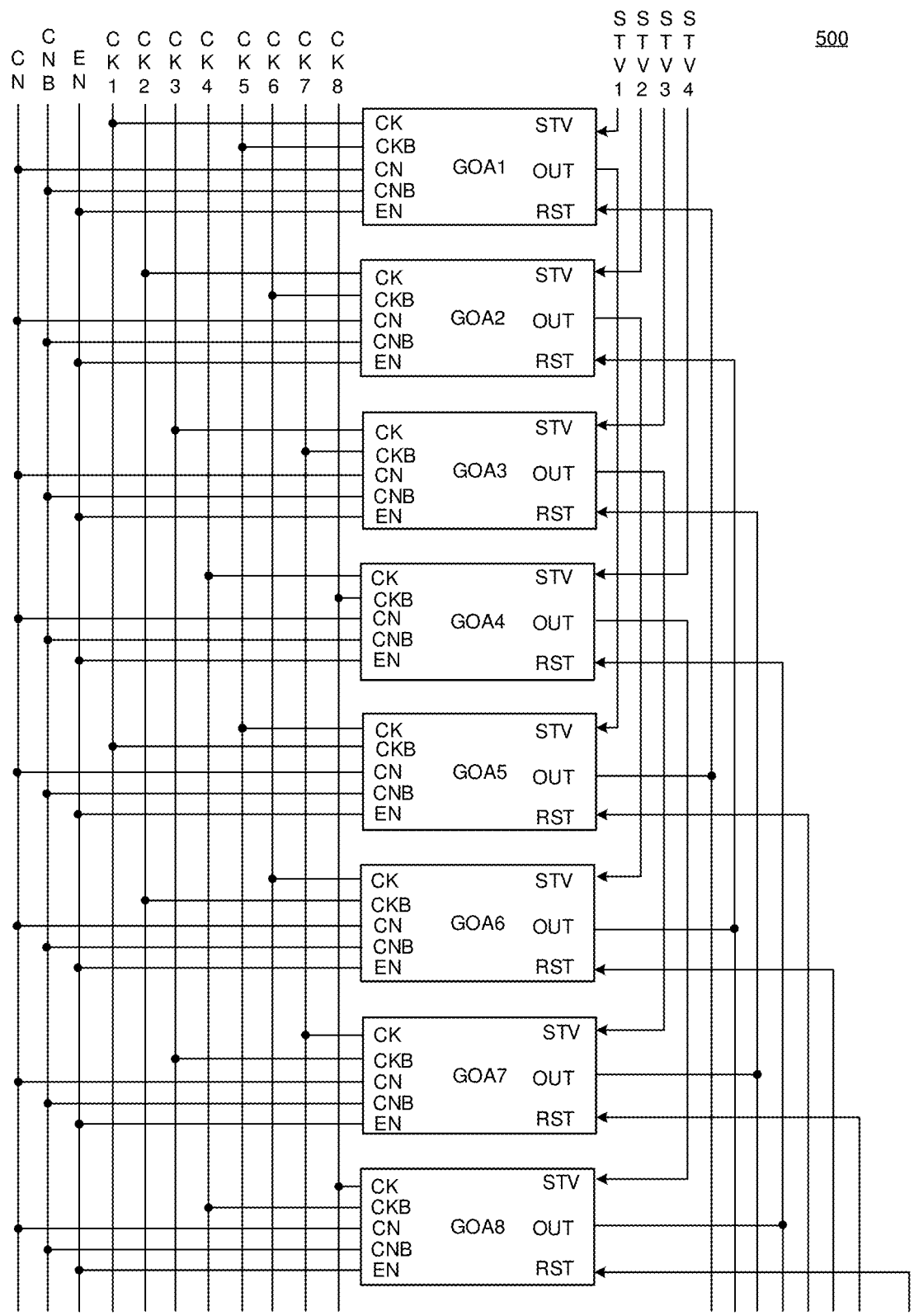
FIG. 5 shows a schematic diagram of a gate driving circuit according to an embodiment of the present disclosure.

FIG. 5 shows a schematic diagram of a gate driving circuit according to an embodiment of the present disclosure.

As shown in FIG. 5, a gate driving circuit 500 may include N-stage cascaded shift registers. For ease of description, eight shift registers GOA1 to GOA8 are shown in FIG. 5. However, the embodiments of the present disclosure are not limited thereto. A number of the shift registers may be set as required. Each of the shift registers GOA1 to GOA8 may be implemented by the shift register of any of the embodiments described above, such as the shift register 100, 200A, 200B, 200C, 200D, 300 or 400.

The shift registers GOA1 to GOA8 have respective input signal terminals CN connected to receive an input signal CN, respective reset signal terminals CNB connected to receive a reset signal CNB, and respective second control signal terminals EN connected to receive a second control signal EN. It should be noted here that since the input signal terminals CN of the shift registers receive the same input signal, the input signal and the input signal terminal are denoted by the same reference sign CN in order to simplify the description. For the same reason, the reset signal terminal and the reset signal are denoted by the same reference sign CNB, and the second control signal terminal and the second control signal are denoted by the same reference sign EN.

According to the embodiments of the present disclosure, the input control terminal STV of an nth stage shift register is connected to the output signal terminal OUT of an (n−i)th stage shift register, and the reset control terminal RST of the nth stage shift register is connected to the output signal terminal OUT of an (n+j)th stage shift register.

In FIG. 5, i=j=4, the input control terminal STV of the nth stage shift register is connected to the output signal terminal OUT of an (n−4)th stage shift register, and the reset control terminal RST of the nth stage shift register is connected to the output signal terminal OUT of an (n+4)th stage shift register. For example, the output signal terminal OUT of the first stage shift register GOA1 is connected to the input control terminal STV of the fifth stage shift register GOA5, the output signal terminal OUT of the second stage shift register GOA2 is connected to the input control terminal STV of the sixth stage shift register GOA6, and so on. The reset control terminal RST of the first stage shift register GOA1 is connected to the output signal terminal OUT of the fifth stage shift register GOA5, the reset control terminal RST of the second stage shift register GOA2 is connected to the output signal terminal OUT of the sixth stage shift register GOA6, and so on. The input signal terminals STV of the first stage shift register GOA1 to the fourth stage shift register GOA4 are respectively connected to receive start signals STV1 to STV4.

According to the embodiments of the present disclosure, the N-stage cascaded shift registers may be divided into at least one group, and each group may include K-stage cascaded shift registers. The clock signal terminals CK of the K-stage cascaded shift registers are respectively connected to receive K clock signals, and the first control signal terminals CKB of the K-stage cascaded shift registers are respectively connected to receive the K clock signals, where each of N, K, n, i and j is an integer, 1≤n≤N, 1<K≤N. In FIG. 5, K=8, and each group of shift registers includes eight shift registers. For example, the first stage shift register GOA1 to the eighth stage shift register GOA8 as a group are respectively connected to receive eight clock signals CK1 to CK8.

In the group of shift registers GOA1 to GOA8 shown in FIG. 5, the clock signal terminal CK of the first stage shift register GOA1 is connected to receive a first clock signal CK1, and the first control signal terminal CKB of the first stage shift register GOA1 is connected to receive a fifth clock signal CK5; the clock signal terminal CK of the second stage shift register GOA2 is connected to receive a second clock signal CK2, and the first control signal terminal CKB of the second stage shift register GOA2 is connected to receive a sixth clock signal CK6; the clock signal terminal CK of the third stage shift register GOA3 is connected to receive a third clock signal CK3, and the first control signal terminal CKB of the third stage shift register GOA3 is connected to receive a seventh clock signal CK7; the clock signal terminal CK of the fourth stage shift register GOA4 is connected to receive a fourth clock signal CK4, and the first control signal terminal CKB of the fourth stage shift register GOA4 is connected to receive an eighth clock signal CK8; the clock signal terminal CK of the fifth stage shift register GOA5 is connected to receive the fifth clock signal CK5, and the first control signal terminal CKB of the fifth stage shift register GOA5 is connected to receive the first clock signal CK1; the clock signal terminal CK of the sixth stage shift register GOA6 is connected to receive the sixth clock signal CK6, and the first control signal terminal CKB of the sixth stage shift register GOA6 is connected to receive the second clock signal CK2; the clock signal terminal CK of the seventh stage shift register GOA7 is connected to receive the eighth clock signal CK7, and the first control signal terminal CKB of the seventh stage shift register GOA7 is connected to receive the third clock signal CK3; the clock signal terminal CK of the eighth stage shift register GOA8 is connected to receive the eighth clock signal CK8, and the first control signal terminal CKB of the eighth stage shift register GOA8 is connected to receive the fourth clock signal CK4. A second group of shift registers GOA9 to GOA16 are respectively connected to receive clock signals CK1 to CK8 in a manner similar to GOA1 to GOA8, and so on.

The other signal terminals (if any) of the shift registers GOA1 to GOA8 of the gate driving circuit 500 are respectively connected to receive signals for the signal terminals. For example, the power signal terminal VGH of each of the shift registers GOA1 to GOA8 is connected to receive a power signal, the reference signal terminal VGL is connected to receive the reference signal, and the master reset signal terminal RESET is connected to receive the master reset signal.

Figure 6:
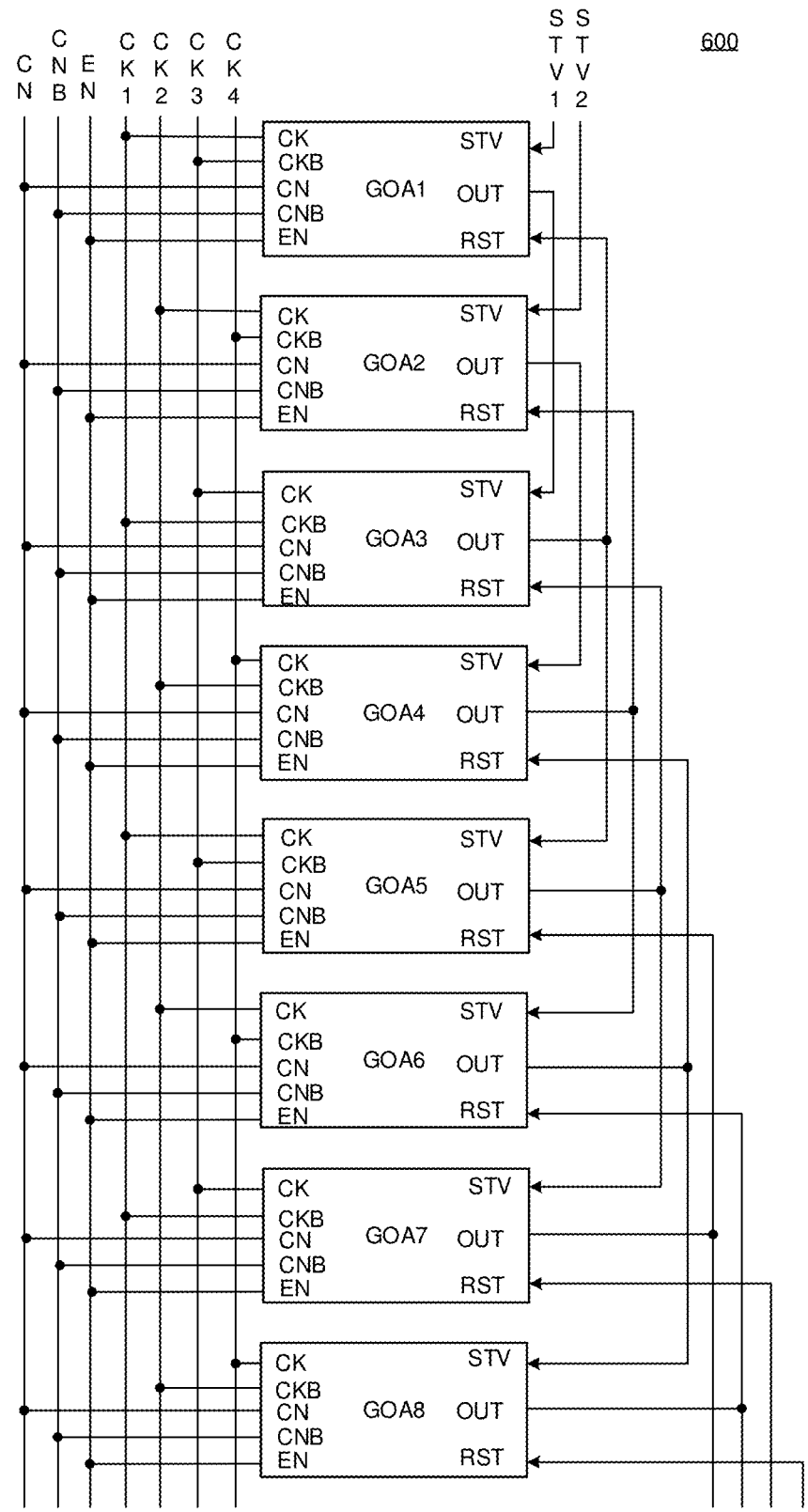
FIG. 6 shows a schematic diagram of a gate driving circuit according to another embodiment of the present disclosure.

FIG. 6 shows a schematic diagram of a gate driving circuit according to another embodiment of the present disclosure. A gate driving circuit 600 of FIG. 6 is similar to the gate driving circuit 500 of FIG. 5, and a difference lies at least in i=j=2 and K=4. In order to simplify the description, the following will mainly describe the different parts in detail.

As shown in FIG. 6, the input control terminal STV of the nth stage shift register is connected to the output signal terminal OUT of the (n−2)th stage shift register, and the reset control terminal RST of the nth stage shift register is connected to the output signal terminal OUT of the (n+2)th stage shift register. For example, the output signal terminal OUT of the first stage shift register GOA1 is connected to the input control terminal STV of the third stage shift register GOA3, the output signal terminal OUT of the second stage shift register GOA2 is connected to the input control terminal STV of the fourth stage shift register GOA4, and so on. The reset control terminal RST of the first stage shift register GOA1 is connected to the output signal terminal OUT of the third stage shift register GOA3, the reset control terminal RST of the second stage shift register GOA2 is connected to the output signal terminal OUT of the fourth stage shift register GOA4, and so on. The input signal terminal STV of the first stage shift register GOA1 and the input signal terminal STV of the second stage shift register GOA2 are respectively connected to receive the start signals STV1 and STV2.

The gate driving circuit 600 is controlled by four clock signals CK1 to CK4, and adjacent four-stage shift registers as a group are respectively connected to receive the clock signals CK1 to CK4. For example, in the first group of shift registers GOA1 to GOA4, the clock signal terminal CK of the first stage shift register GOA1 is connected to receive the first clock signal CK1, and the first control signal terminal CKB of the first stage shift register GOA1 is connected to receive the third clock signal CK3; the clock signal terminal CK of the second stage shift register GOA2 is connected to receive the second clock signal CK2, and the first control signal terminal CKB of the second stage shift register GOA2 is connected to receive the fourth clock signal CK4; the clock signal terminal CK of the third stage shift register GOA3 is connected to receive the third clock signal CK3, and the first control signal terminal CKB of the third stage shift register GOA3 is connected to receive the first clock signal CK1; the clock signal terminal CK of the fourth stage shift register GOA4 is connected to receive the fourth clock signal CK4, and the first control signal terminal CKB of the fourth stage shift register GOA4 is connected to receive the second clock signal CK2. A second group of shift registers GOA5 to GOA8 are respectively connected to receive the clock signals CK1 to CK4 in a manner similar to the first group of shift registers GOA1 to GOA4.

Figure 7A:
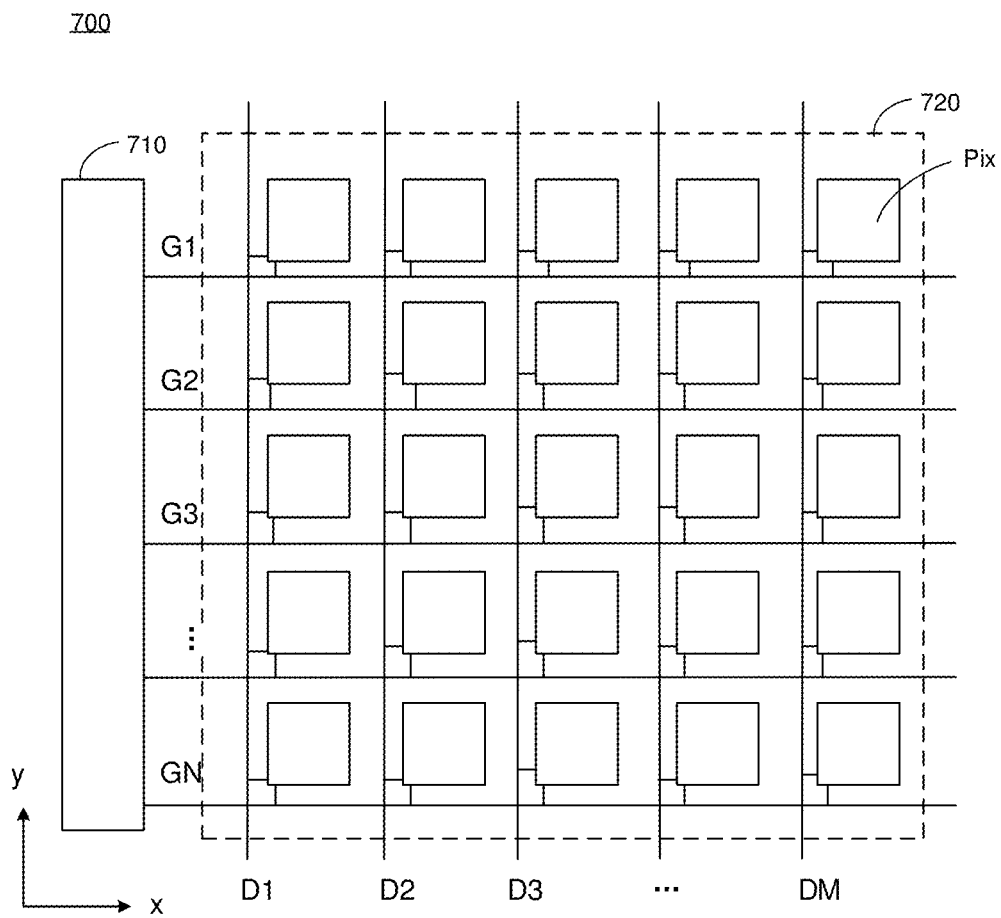
FIG. 7A shows a schematic diagram of a display panel according to an embodiment of the present disclosure.

FIG. 7A shows a schematic diagram of a display panel according to an embodiment of the present disclosure.

As shown in FIG. 7A, a display panel 700 may include a plurality of sub-pixels Pix arranged in an array and a gate driving circuit 710. The gate driving circuit 710 may be implemented by the gate driving circuit of any of the embodiments described above, and the multi-stage shift registers in the gate driving circuit 710 are respectively connected to a plurality of rows of sub-pixels Pix in the array. As shown in FIG. 7A, the plurality of sub-pixels Pix are located in a display area 720. The plurality of sub-pixels Pix are arranged in an N×M array, N rows of sub-pixels Pix are respectively connected to N gate signal lines G1 to GN, and M columns of sub-pixels Pix are respectively connected to M data lines D1 to DM. N output signals generated by the N-stage shift registers in the gate driving circuit 710 are provided to the gate lines G1 to GN, respectively. Certainly, the embodiments of the present disclosure are not limited to this. The sub-pixels Pix may be arranged in other forms of arrays as required, the rows and columns of the sub-pixels Pix may be connected to the gate lines and the data lines in a different manner, and the output signal terminal of the gate driving circuit 710 may be connected to the gate lines in a different manner. For example, one gate line may be connected to two rows of sub-pixels, or two gate lines may be connected to one row of sub-pixels. For another example, each output signal terminal in the gate driving circuit 710 may be connected to one gate line or a plurality of gate lines, and so on.

Figure 7B:
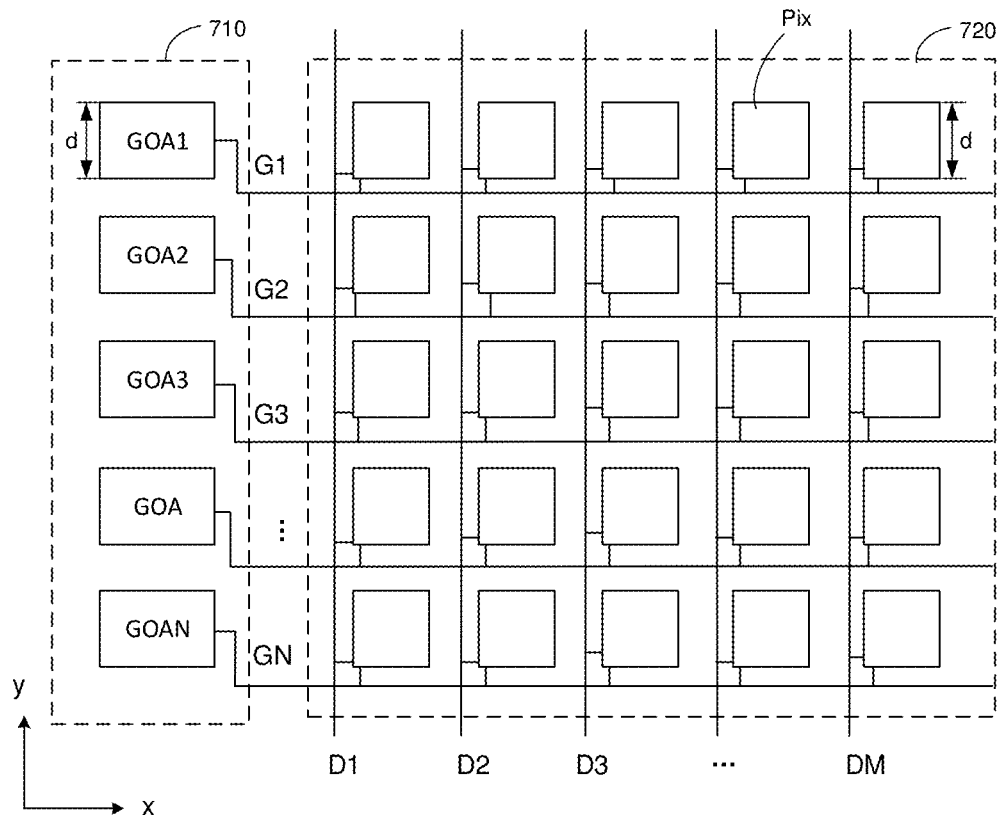
FIG. 7B shows a schematic diagram of a layout of the display panel in FIG. 7A.

FIG. 7B shows a schematic diagram of a layout of the display panel of FIG. 7A. As shown in FIG. 7B, the gate driving circuit 710 may be implemented by the gate driving circuit described above. The N shift registers GOA1 to GOAN in the gate driving circuit 710 are arranged in a y-direction (a column direction of the sub-pixel array, also called a second direction, which is a vertical direction in FIG. 7B), and connected to the gate lines G1 to GN in a one-to-one correspondence, so as to be connected to the sub-pixels Pix in the display area 720. As shown in FIG. 7B, a size of each of the shift registers GOA1 to GOAN in the y-direction may be 0.8 to 1.4 times a size of the sub-pixel Pix in the y-direction. Preferably, the size of each of the shift registers GOA1 to GOAN in the y-direction is substantially the same as the size of the sub-pixel Pix in the y-direction (both are denoted by d in FIG. 7B). The so-called size here may refer to a size of a projection on a base substrate of a display panel. For example, in FIG. 7B, a distance across a projection of each of the shift registers GOA1 to GOAN on the base substrate of the display panel in the y-direction may represent the size d of the shift register in the y-direction. Similarly, as shown in FIG. 7B, a distance across a projection of the sub-pixel Pix on the base substrate in the y-direction may represent the size d of the sub-pixel Pix in the y-direction.

Figure 7C:
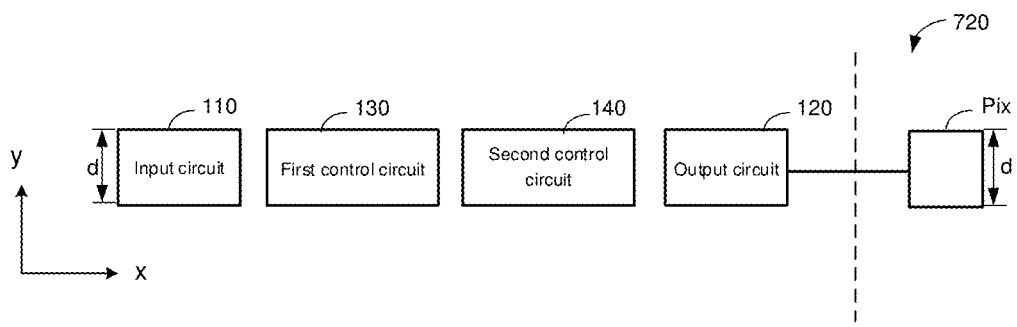
FIG. 7C shows a schematic diagram of a layout of the shift register in FIG. 7B.

FIG. 7C shows a schematic diagram of a layout of the shift register in FIG. 7B. As shown in FIG. 7C, the shift register may be implemented by the shift register of any of the embodiments described above, and may include, for example, the input circuit 110, the first control circuit 130, the second control circuit 140, and the output circuit 120. The input circuit 110, the first control circuit 130, the second control circuit 140 and the output circuit 120 are sequentially arranged in an x-direction (a row direction of the sub-pixel array, also referred to as a first direction, which is perpendicular to the y-direction). As shown in FIG. 7C, each of the input circuit 110, the first control circuit 130, the second control circuit 140 and the output circuit 120 has a size d in the y-direction, which is the same as the size d of the sub-pixel in the y-direction. In FIG. 7C, the shift register arranged on a left side of the display area 720 is illustrated by way of example. The input circuit 110, the first control circuit 130, the second control circuit 140 and the output circuit 120 are arranged from left to right, so as to gradually approach the display area 720 in this order. Similarly, in a case that the shift register is located on a right side of the display area 720, the input circuit 110, the first control circuit 130, the second control circuit 140 and the output circuit 120 are arranged from right to left, so as to gradually approach the display area 720 in this order. By sequentially arranging the input circuit 110, the first control circuit 130, the second control circuit 140 and the output circuit 120 in the x-direction, an arrangement size of each shift register in the y-direction may be reduced as much as possible, so as to increase the number of shift registers in the y-direction while ensuring a width-to-length ratio of each TFT in the shift register, which is beneficial to increase a resolution of the display panel and achieve a narrow frame of the display panel in the y-direction.

In FIG. 7B and FIG. 7C, a projection of the shift register as well as the input circuit 110, the first control circuit 130, the second control circuit 140 and the output circuit 120 of the shift register on the base substrate is shown as a substantially rectangular shape. The size of the shift register in the y-direction is represented by a side length of the rectangle in the y-direction. However, the embodiments of the present disclosure are not limited to this. The projection of the shift register as well as the input circuit, the first control circuit, the second control circuit and the output circuit of the shift register on the base substrate may be designed into other shapes or even irregular shapes as required, as long as the size of the shift register in the y-direction is substantially the same as the size of the sub-pixel in the y-direction.

Figure 8:
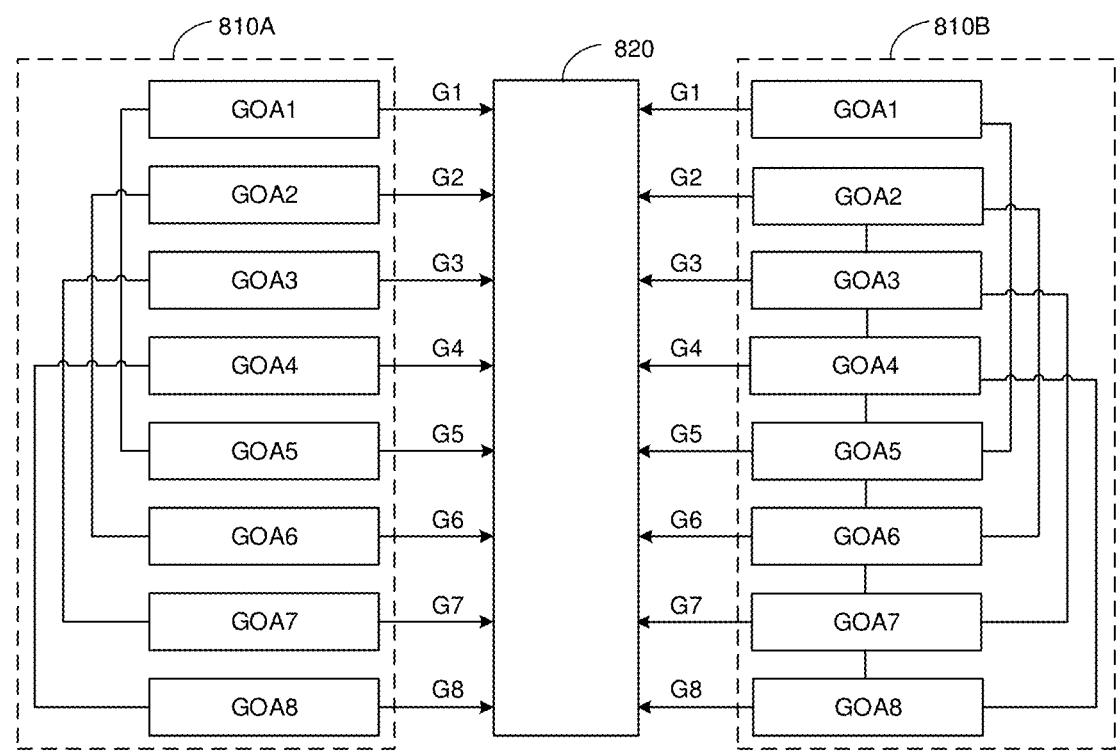
FIG. 8 shows a schematic diagram of a display panel according to another embodiment of the present disclosure.

FIG. 8 shows a schematic diagram of a display panel according to another embodiment of the present disclosure. A display panel 800 of FIG. 8 is similar to the display panel 700 of FIG. 7A, and a difference lies at least in that the display panel 800 includes two gate driving circuits 810A and 810B. In order to simplify the description, the following will mainly describe the different parts in detail. As shown in FIG. 8, the display panel 800 may include a display area 820, and the above description for the display area 720 is also applicable to the display area 820. The gate driving circuits 810A and 810B are respectively located on both sides of the array of the plurality of sub-pixels in the x-direction (the row direction of the sub-pixel array, also referred to as the first direction, which is a horizontal direction in FIG. 8). Each of the gate driving circuits 810A and 810B may be implemented by the gate driving circuit 500 described above. For the sake of conciseness, only a cascade connection between the shift registers GOA1 to GOAN is shown in FIG. 8, and connections between the shift register and control signals such as the clock signals are omitted. As shown in FIG. 8, the output signal terminal of the first stage shift register GOA1 in the gate driving circuit 810A is connected from the left to the gate line G1 for the first row of sub-pixels, and the output signal terminal of the first stage shift register GOA1 in the gate driving circuit 810B is connected from the right to the gate line G1 for the first row of sub-pixels. In a similar manner, the second stage shift register GOA2 of the gate driving circuit 810A and the second stage shift register GOA2 of the gate driving circuit 810B are connected respectively from the left and the right to the gate line G2, and so on. In this way, it is possible to apply gate driving signals to the gate lines from both sides, and for a large-size display panel, it is possible to mitigate a signal attenuation caused by excessively long gate lines.

Figure 9:
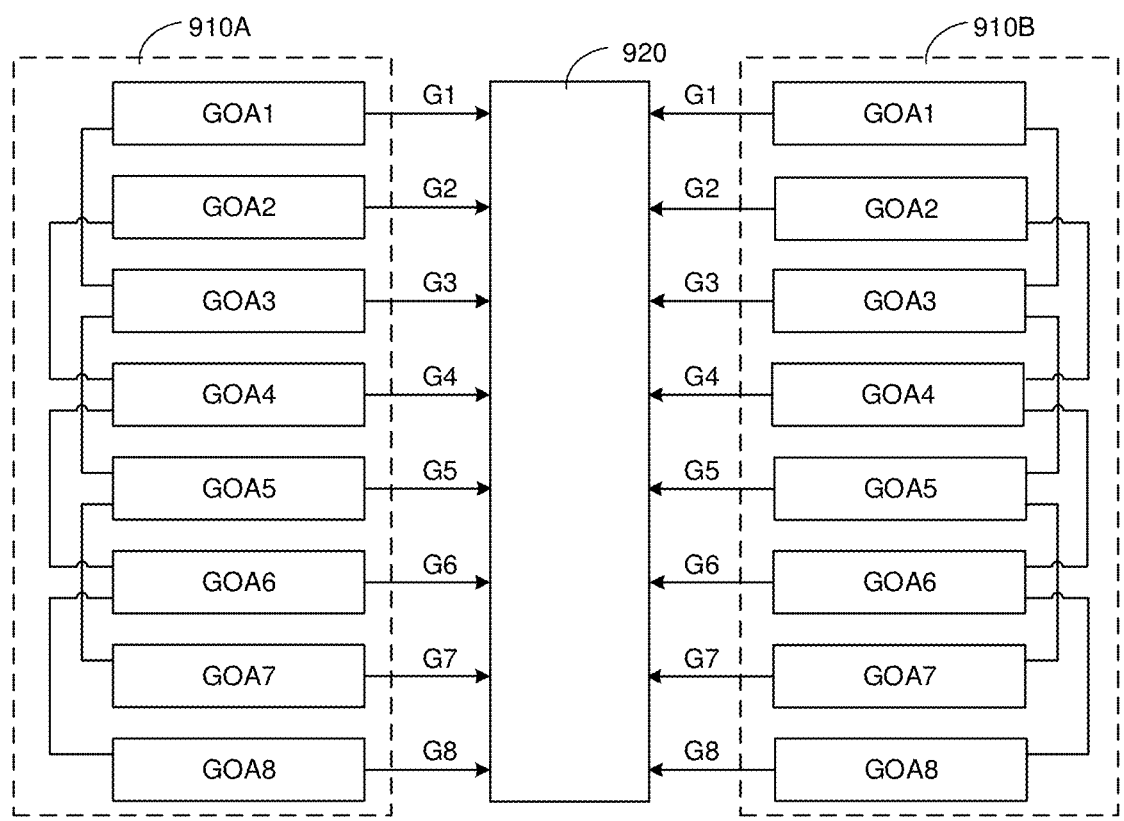
FIG. 9 shows a schematic diagram of a display panel according to another embodiment of the present disclosure.

FIG. 9 shows a schematic diagram of a display panel according to another embodiment of the present disclosure. Similar to the display panel 800 of FIG. 8, a display panel 900 of FIG. 9 includes a display area 920 and gate driving circuits 910A and 910B respectively located on both sides of the display area 920. Different from the display panel 800, each of the gate driving circuits 910A and 910B in the display panel 900 is implemented by the gate driving circuit 600 described above. For the sake of conciseness, FIG. 9 only shows the cascade connection between the shift registers GOA1 to GOAN, and the connection between the shift register and control signals such as the clock signals is omitted. Similar to FIG. 8, the shift registers GOA1 to GOAN of the gate driving circuit 910A in FIG. 9 are respectively connected from the left to the gate lines G1 to GN, and the shift registers GOA1 to GOAN of the gate driving circuit 910B are respectively connected from the right to the gate lines G1 to GN.

Figure 10:
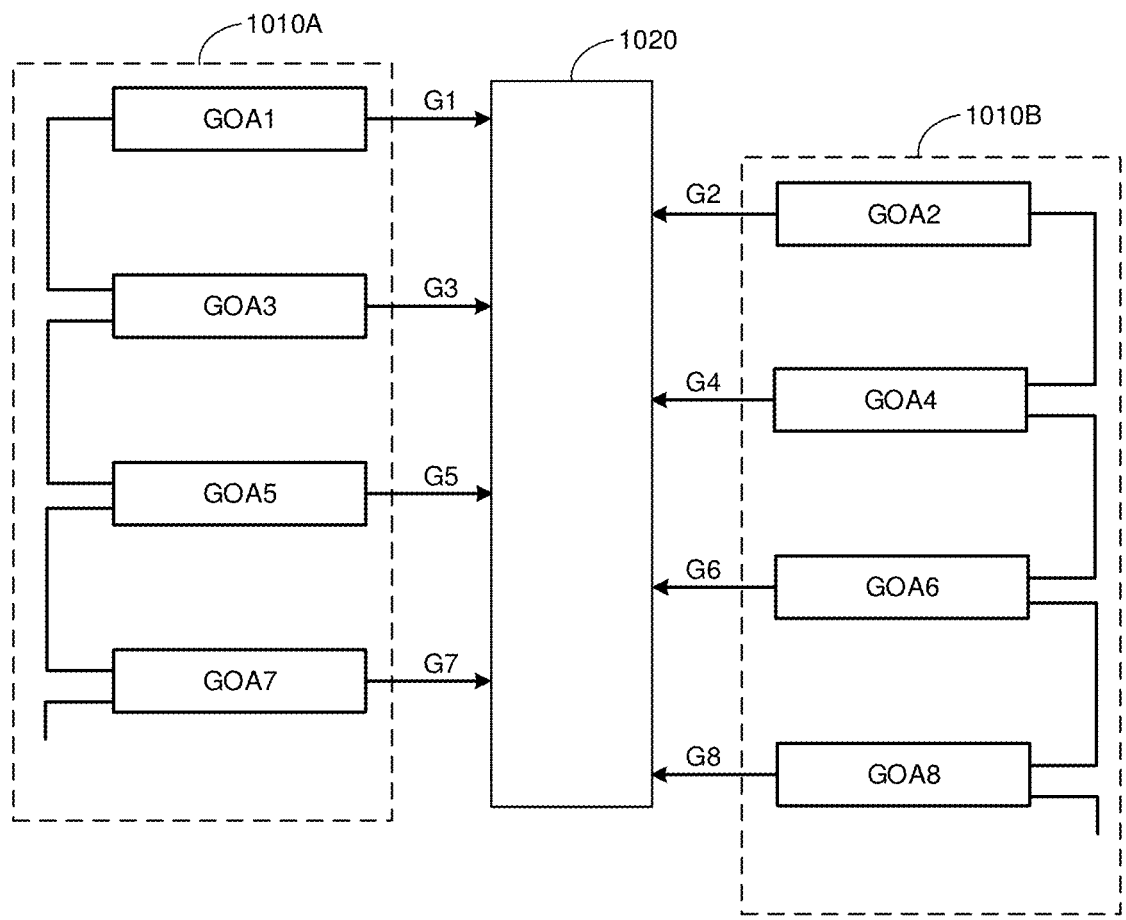
FIG. 10 shows a schematic diagram of a display panel according to another embodiment of the present disclosure.

FIG. 10 shows a schematic diagram of a display panel according to another embodiment of the present disclosure. Similar to the display panel 700 of FIG. 7A, a display panel 1000 of FIG. 10 includes a gate driving circuit and a plurality of sub-pixels located in a display area 1020. The gate driving circuit is implemented by using a structure of the gate driving circuit 500. Odd-numbered stage shift registers GOA1, GOA3, . . . GOA(N−1) (indicated by a dashed box 1010A in FIG. 10) are arranged on one side of the display area 1020 (the left side in FIG. 10) in the x-direction, and even-numbered stage shift registers GOA2, GOA4, . . . GOAN (indicated by a dashed box 1010B in FIG. 10) are arranged on the other side of the display area 1020 (the right side in FIG. 10) in the x-direction. For the sake of conciseness, FIG. 10 only shows the cascade connection between the shift registers GOA1 to GOAN, and the connection between the shift register and the control signals such as the clock signals is omitted. As shown in FIG. 10, the odd-numbered stage shift registers GOA1, GOA3, . . . GOA(N−1) are respectively connected from the left to the gate lines G1, G3, . . . G(N−1), and the even-numbered stage shift registers GOA2, GOA4, . . . GOAN are respectively connected from the right to the gate lines G2, G4, . . . GN.

Figure 11:
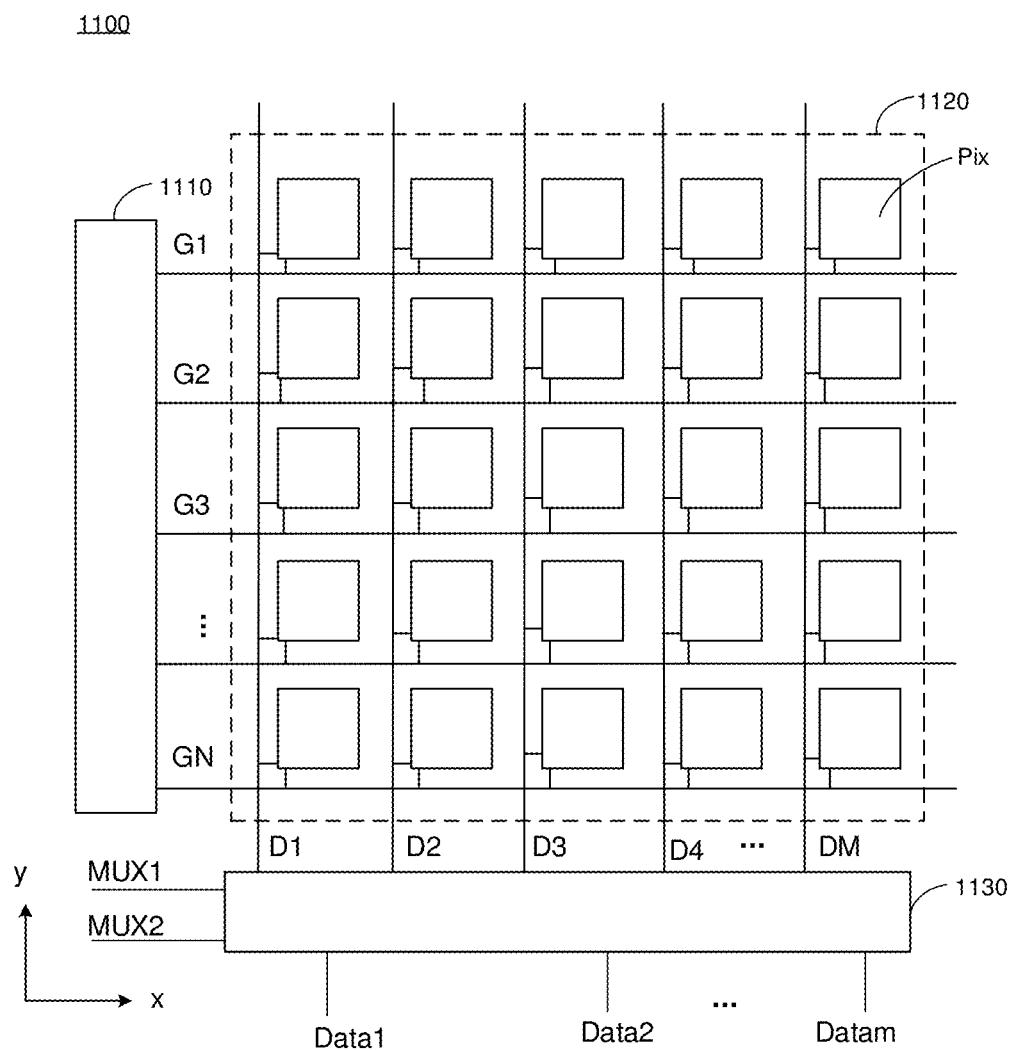
FIG. 11 shows a schematic diagram of a display panel according to another embodiment of the present disclosure.

FIG. 11 shows a schematic diagram of a display panel according to another embodiment of the present disclosure. Similar to FIG. 10, a display panel 1100 of FIG. 11 includes a plurality of sub-pixels Pix located in a display area 1120 and a gate driving circuit 1110 connected to the plurality of sub-pixels Pix. The gate driving circuit 1100 may be connected to the sub-pixels Pix in any manner described with reference to FIG. 8 to FIG. 10. As shown in FIG. 11, the display panel 1100 may further include a multiplexing circuit 1130. The multiplexing circuit 1130 is connected to M columns of sub-pixels in the sub-pixel array through M data lines D1 to DM. The multiplexing circuit 1130 may be, for example, connected to a data driving circuit (such as a driving IC) to receive m input data signals Data1 to Datam. The multiplexing circuit 1130 may multiplex the m input data signals Data1 to Datam received into M output data signals under the control of a first selection signal MUX1 and a second selection signal MUX2. The M output data signals are respectively provided to the data lines D1 to DM, and then to the M columns of sub-pixels Pix. m is an integer greater than 1, M is an integer greater than 1, and M is an integer multiple (for example, twice) of m.

Figure 12:
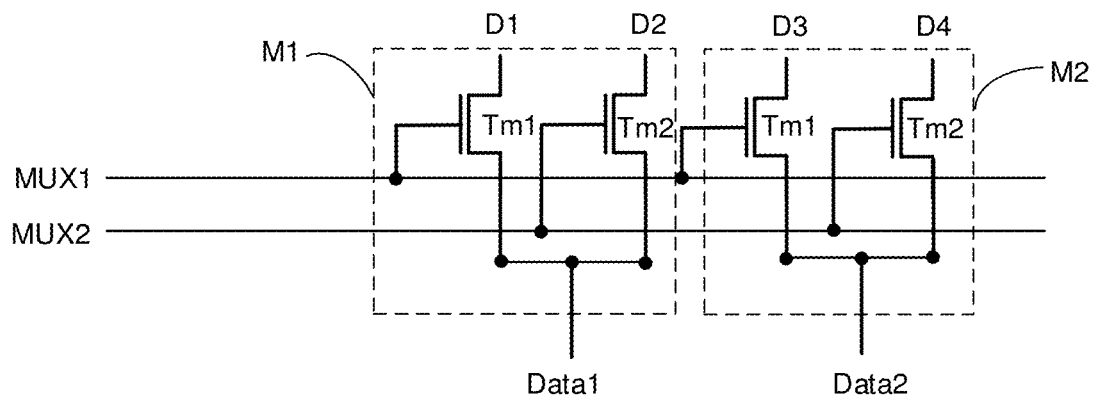
FIG. 12 shows a circuit diagram of a multiplexing circuit according to some embodiments of the present disclosure.

FIG. 12 shows a circuit diagram of a multiplexing circuit according to some embodiments of the present disclosure. As shown in FIG. 12, the multiplexing circuit includes a plurality of multiplexing units M1, M2 . . . , two of which are shown in FIG. 12 for conciseness. In FIG. 12, M/m=2, and each multiplexing unit of the multiplexing circuit 1130 may multiplex an input data signal received into two output data signals and provide the output data signals to two data lines respectively, so as to achieve a one-to-two multiplexing. For example, the multiplexing unit M1 may multiplex the received input data signal Data1 into two output data signals which are respectively provided to the data lines D1 and D2, and the multiplexing unit M2 may multiplex the received input data signal Data2 into two output data signals which are respectively provided to the data lines D3 and D4. As shown in FIG. 12, each multiplexing unit includes transistors Tm1 and Tm2. For example, in the multiplexing unit M1, the transistor Tm1 has a gate electrode connected to a first selection signal line so as to receive the first selection signal MUX1, a first electrode connected to receive the input data signal Data1, and a second electrode connected to the data line D1; the transistor Tm2 has a gate electrode connected to a second selection signal line so as to receive the second selection signal MUX2, a first electrode connected to receive the input data signal Data1, and a second electrode connected to the data line D2. When the first selection signal MUX1 is at a high level, the transistor Tm1 is turned on, so as to provide the received input data signal Data1 to the data line D1; when the second selection signal MUX2 is at a high level, the transistor Tm2 is turned on, so as to provide the input data signal Data1 to the data line D2. Other multiplexing units may operate in a similar manner, which is not repeated here.

Figure 13:
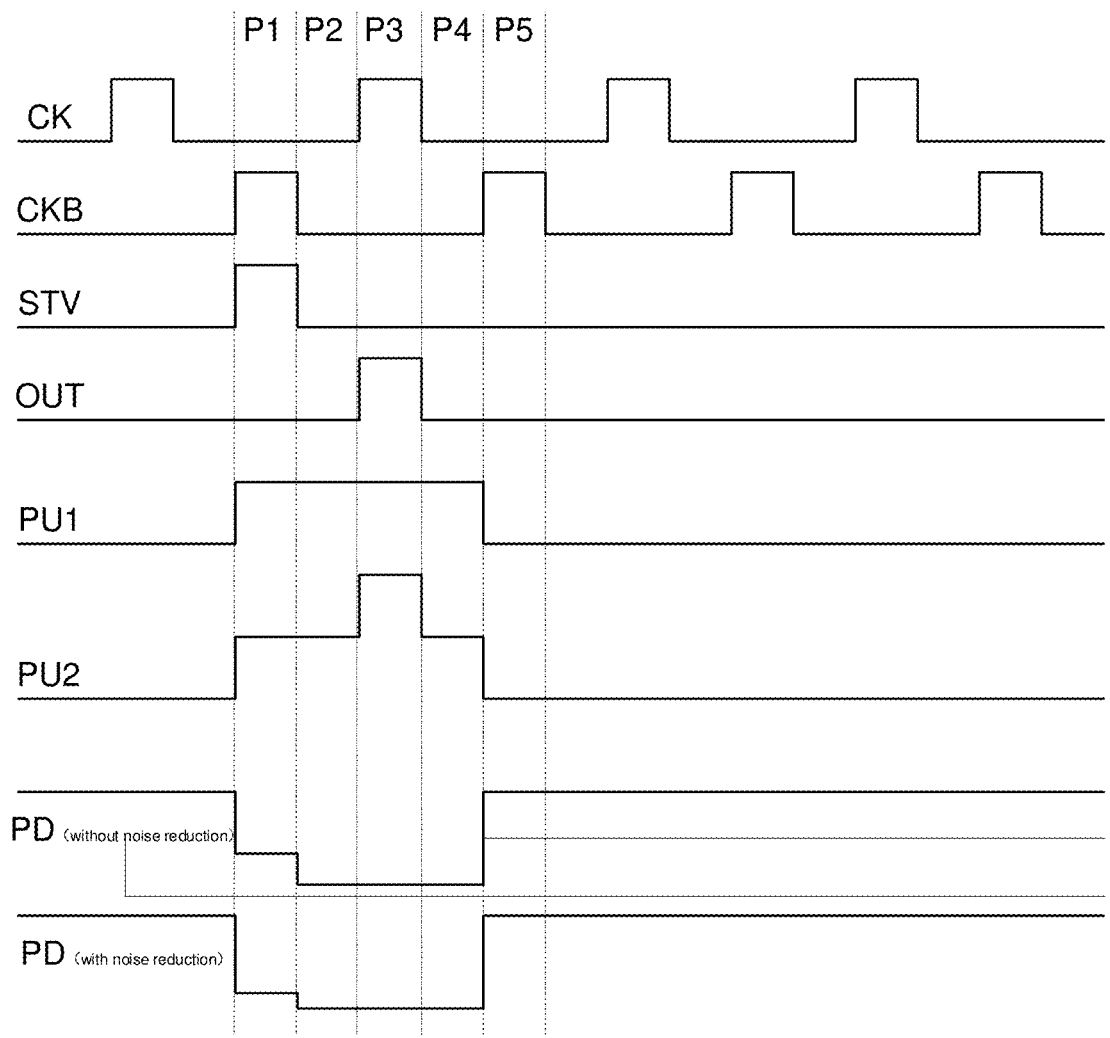
FIG. 13 shows a signal timing diagram of the shift register in a display phase according to an embodiment of the present disclosure.

FIG. 13 shows a signal timing diagram of the shift register in a display phase according to an embodiment of the present disclosure. A signal timing of FIG. 13 is applicable to the shift register of any of the embodiments described above. The shift register 300 of FIG. 3 is illustrated below by way of example in describing the signal timing of FIG. 13. In the display phase, the input signal terminal CN and the power signal terminal VGH are maintained at a high level, and the reset signal terminal RST and the reference signal terminal RST are maintained at a low level.

In a period P1, the input control terminal STV is at a high level, and the eleventh transistor T11 is turned on, so that the high level of the input signal terminal CN is input to the first pull-up node PU1 The high level of the power signal terminal VGH turns on the tenth transistor T10, so that the second pull-up node PU2 is at a high level. The high level of the second pull-up node PU2 turns on the twelfth transistor T12. At this time, since the clock signal at the clock signal terminal CK is at a low level, the output signal terminal OUT is at a low level. The first control signal terminal CKB is at a high level, the seventh transistor T7 is turned on, and the high level of the first pull-up node PU1 turns on the ninth transistor T9, so as to pull down the potential of the pull-down node PD by using the low level of the reference signal terminal VGL. At this time, if the noise reduction circuit 360 is not provided, as analyzed above, a desired low-level value of the potential of the pull-down node PD (as indicated by "PD (without noise reduction)" in FIG. 13) may not be achieved because the seventh transistor T7 and the ninth transistor T9 are simultaneously in ON state, which may affect the potential of the first pull-up node PU1 By providing the noise reduction circuit 360, the high level of the input control terminal STV may turn on the sixth transistor T6, so as to further pull down the potential of the pull-down node PD (as indicated by "PD (with noise reduction)" in FIG. 13) by using the potential of the reference signal terminal VGL. As shown in FIG. 13, the potential of the pull-down node PD is reduced compared to the case without the noise reduction circuit 360.

In a period P2, the input control terminal STV and the first control signal terminal CKB change to a low level, the eleventh transistor T11 and the seventh transistor T7 are turned off, and the first pull-up node PU1 and the second pull-up node PU2 are maintained at a high level due to an existence of the third capacitor C3. At this time, since the seventh transistor T7 is turned off and the ninth transistor T9 is turned on, the potential of the pull-down node PD is further reduced.

In a period P3, the clock signal terminal CK is at a high level. At this time, since the twelfth transistor T12 is in ON state, the high level of the clock signal terminal CK is provided to the output signal terminal OUT. A bootstrap effect of the third capacitor C3 may further increase the potential of the second pull-up node PU2.

In a period P4, the clock signal terminal CK changes to a low level, and the twelfth transistor T12 in ON state causes the output signal terminal OUT to change to a low level. The bootstrap effect of the third capacitor C3 may reduce the potential of the second pull-up node PU2.

In a period P5, the reset control terminal RST is at a high level, so that the low level at the reset signal terminal CNB is provided to the first pull-up node PU1, and the tenth transistor T10 in ON state causes the second pull-up node PU2 to change to a low level. The first control signal terminal CKB is at a high level, and the seventh transistor T7 is turned on, so that the pull-down node PD changes to a high level. The high level of the pull-down node PD turns on the third transistor T3, so as to pull down the output signal terminal OUT to the low level of the reference signal terminal VGL.

In the above process, the second control signal terminal EN is maintained at a low level, and the first transistor T1 and the second transistor are in OFF state.

Although the shift register 300 is illustrated above by way of example in describing the signal timing, the signal timing is also applicable to other shift registers in the embodiments of the present disclosure. For example, the shift register 400 may operate in a manner similar to the above based on the signal timing of FIG. 13. A difference lies in that in the period P5, the second control signal terminal is at a low level, the high level of the pull-down node PD turns on the fifth transistor T5, so as to pull down the output signal terminal OUT to the low level of the reference signal terminal VGL.

Figure 14:
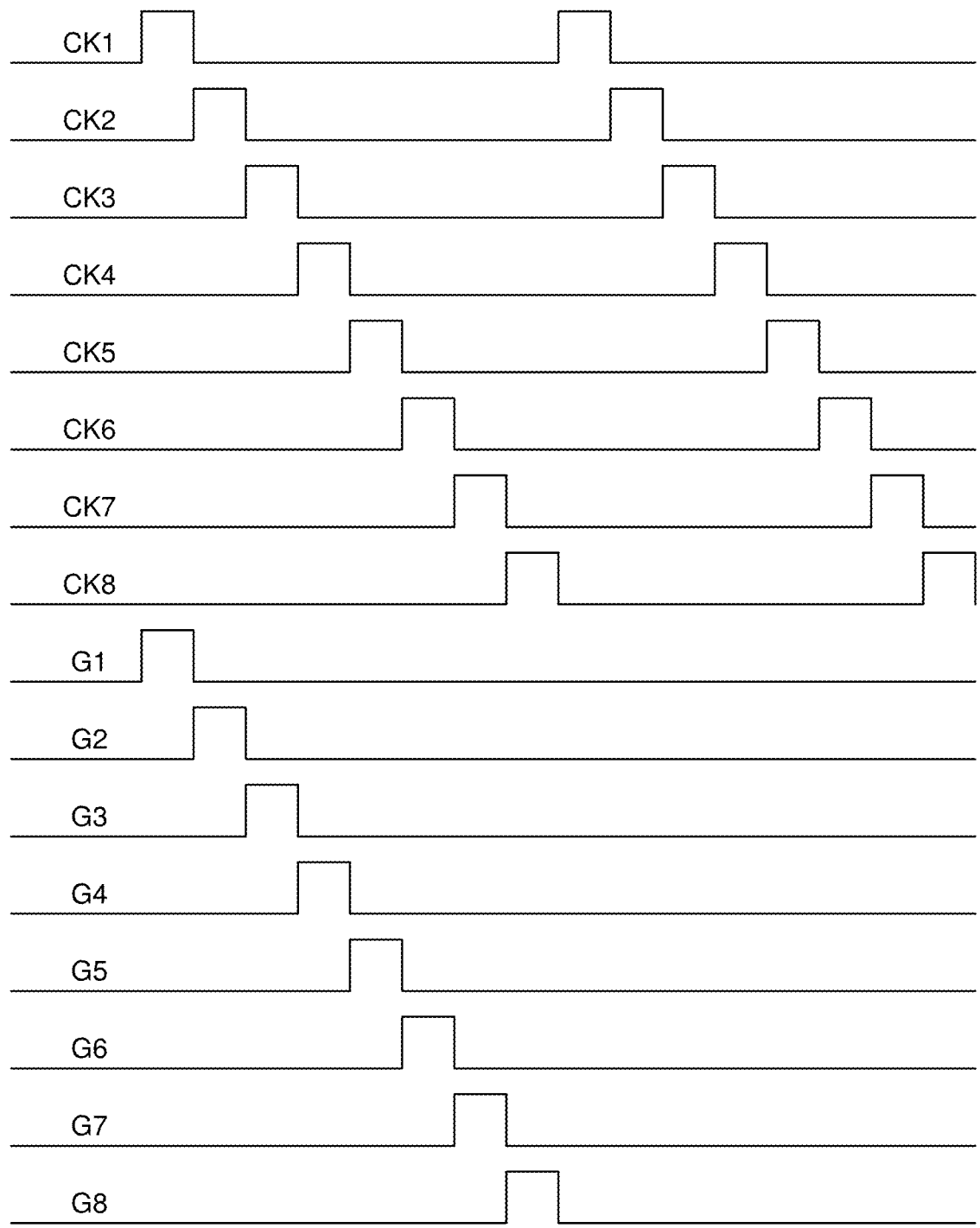
FIG. 14 shows a signal timing diagram of the gate driving circuit in the display phase according to an embodiment of the present disclosure.

FIG. 14 shows a signal timing diagram of the gate driving circuit in the display phase according to some embodiments of the present disclosure. A signal timing of FIG. 14 is applicable to the gate driving circuit 500 described above. As shown in FIG. 14, the gate driving circuit 500 is provided with eight clock signals CK1 to CK8 that are sequentially shifted. Each of the shift registers GOA1 to GOAN in the gate driving circuit 500 may operate, for example, in the manner described above with reference to FIG. 13, so as to output a gate driving signal at the respective output signal terminal OUT based on the clock signal at the respective clock signal terminal CK under the control of the potential of the respective input control terminal STV. N gate driving signals generated by the shift registers GOA1 to GOAN are respectively provided to the gate lines G1 to GN connected thereto. As shown in FIG. 14, the clock signals CK1 to CK8 are periodic signals with a duty ratio of 12.5% and a pulse width equal to a unit scanning time. A (k+1)th clock signal is shifted by the unit scanning time with respect to a kth clock signal, where k is an integer, $1 \leq k \leq 7$. The so-called unit scanning time here refers to a time for scanning a row of pixels by the gate driving circuit. A display panel with 8K resolution is illustrated by way of example. The sub-pixels in the display area of the display panel are arranged in a 7680×4320 array. In a case of a refresh frequency of 60 Hz, the time for scanning a frame is 1/60 second, that is, it takes 1/60 second to scan 4320 rows of sub-pixels, then the time for scanning each row of sub-pixels (that is, the unit scanning time) is $H = 1/60 \div 4320 \approx 3.7$ µs. Similarly, in a case of a refresh frequency of 120 Hz, the unit scanning time H is about 1.85 µs.

Figure 15:
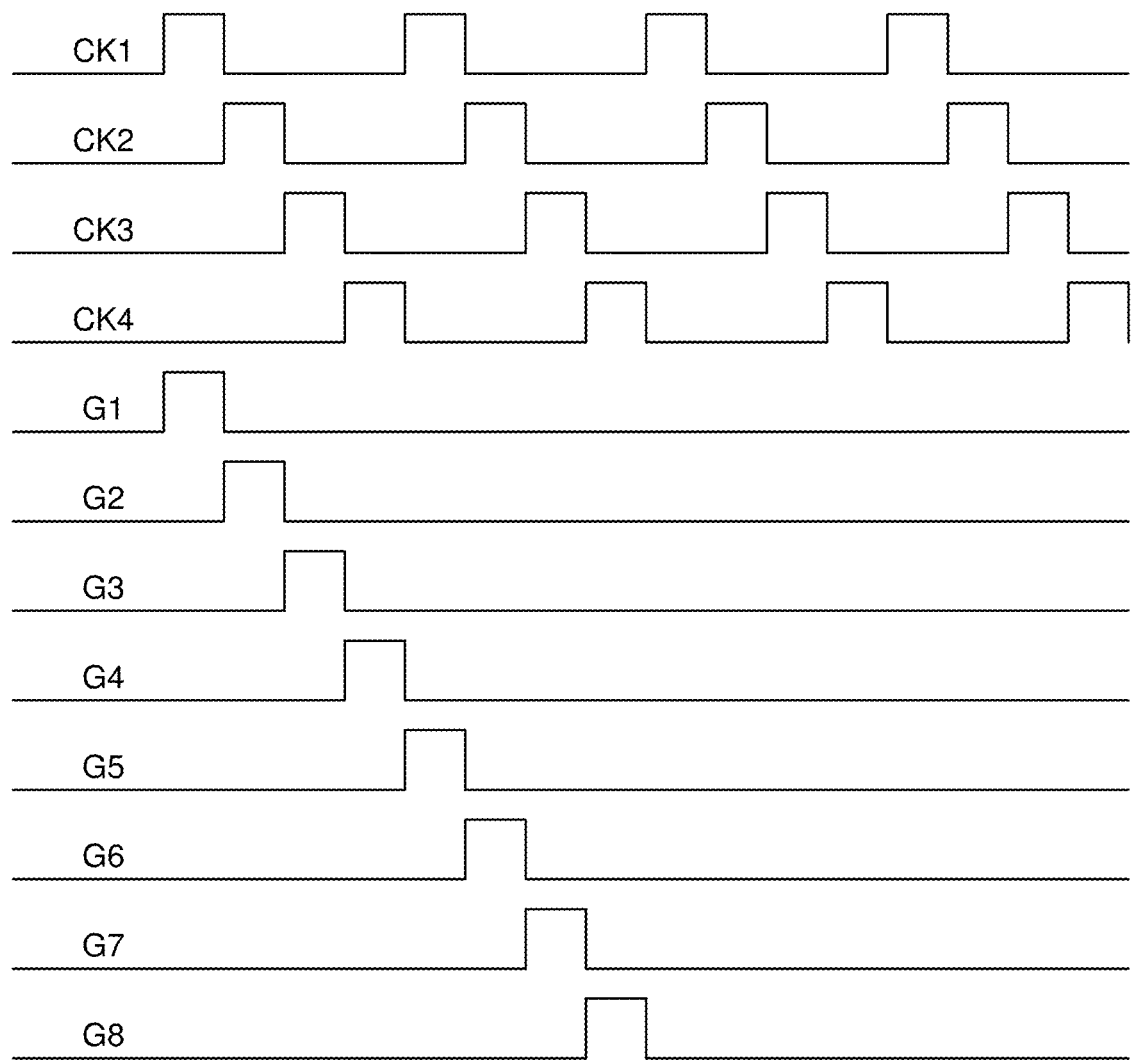
FIG. 15 shows a signal timing diagram of the gate driving circuit in the display phase according to another embodiment of the present disclosure.

FIG. 15 shows a signal timing diagram of the gate driving circuit in the display phase according to another embodiment of the present disclosure. A signal timing of FIG. 15 is applicable to the gate driving circuit 600 described above. As shown in FIG. 15, the gate driving circuit 600 is provided with four clock signals CK1 to CK4 that are sequentially shifted. Each of the shift registers GOA1 to GOAN in the gate driving circuit 600 may operate, for example, in the manner described above with reference to FIG. 13, so as to output a gate driving signal at the respective output signal terminal OUT based on the clock signal at the respective clock signal terminal CK under the control of the potential of the respective input control terminal STV. N gate driving signals generated by the shift registers GOA1 to GOAN are respectively provided to the gate lines G1 to GN connected thereto. As shown in FIG. 15, the clock signals CK1 to CK4 are periodic signals with a duty ratio of 25% and a pulse width equal to a unit scanning time. The (k+1)th clock signal is shifted by the unit scanning time with respect to the kth clock signal, where k is an integer, $1 \leq k \leq 3$.

Figure 16:
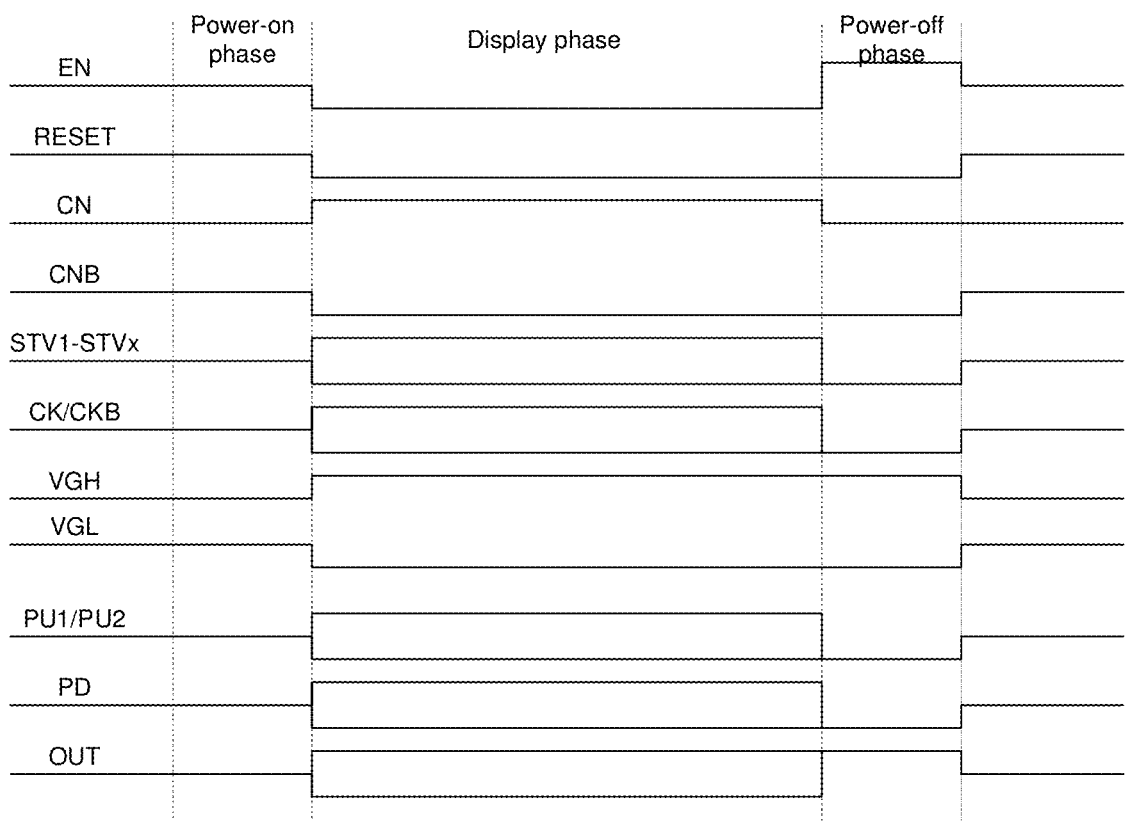
FIG. 16 shows an operation timing diagram of the gate driving circuit according to an embodiment of the present disclosure.

FIG. 16 shows an operation timing diagram of the gate driving circuit according to an embodiment of the present disclosure. A signal timing diagram of FIG. 16 is applicable to the shift register unit of any of the embodiments described above, and the shift register 300 described above is adopted in the gate driving circuit. An operation timing of FIG. 16 covers a power-on phase, a display phase and a power-off phase. For example, when the gate driving circuit is turned on, the process enters the power-on phase; after the power-on is completed, the process enters the display phase, in which the shift registers in the gate driving circuit operate in the manner described above with reference to FIG. 13 to drive the sub-pixels for display; when the gate driving circuit needs to be turned off, the process enters the power-off phase.

In the display phase, the second control signal is at a low level, so that the second control signal terminal EN of each shift register is at a low level. Referring to FIG. 3, the low level of the second control signal terminal EN turns off the first transistor T1 and the second transistor T2, so that a display operation of the shift register is not affected.

In the power-off phase, the second control signal and the power signal provided to the gate driving circuit are at a high level, so that the second control signal terminal EN and the power signal terminal VGH of each shift register are respectively at a high level. Other signals (for example, the master reset signal, the input signal, the reset signal, the start signals STV1 to STVx (e.g., STV1 to STV4 in FIG. 5, or STV1 and STV2 in FIG. 6), the K clock signals and the reference signal) provided to the gate driving circuit are all at a low level, so that the master reset signal terminal RESET, the input signal terminal CN, the reset signal terminal CNB, the clock signal terminal CK, the first control signal terminal CKB and the reference signal terminal VGL of each shift register are all at a low level. In each shift register, referring to FIG. 3, the high level of the second control signal terminal EN turns on the first transistor T1 and the second transistor T2, so that the high level of the second control signal terminal EN is provided to the output signal terminal so as to output an output signal at a high level, and the low level at the reference signal terminal VGL is provided to the pull-down node PD. Since each of the shift registers GOA1 to GOAN in the gate driving circuit outputs a high level, the cascade connection makes the input control terminal STV and the reset control terminal RST of each shift register at a high level, and the eleventh transistor T11 and the thirteenth transistor T13 are turned on, so as to provide the low level of the input signal terminal CN and the reset signal terminal CNB to the pull-up node PUL Since the power signal terminal VGH is at a high level, the tenth transistor T10 is turned on, so that the second pull-up node PU2 is also at a low level. Through the above method, the gate driving circuit may be powered off, so that the output signal terminal OUT of each shift register is at a high level, the first pull-up node PU1 and the second pull-up node PU2 are at a high level, and the pull-down node is at a low level.

By setting the pull-up node (such as the first pull-up node PU1 and the second pull-up node PU2) to a low level in the power-off phase, when the gate driving circuit is powered on again, it is possible to avoid an undesired output due to failing to set the pull-up node to a low level in the power-on phase. In this way, the function of pulling down the pull-up node is not necessary in the power-on process, so that a restriction on the power-up is relaxed. For example, in FIG. 16, all signals provided to the gate driving circuit in the power-on phase are at a ground level, such as an intermediate level between a high level and a low level, so that the signal terminals of each shift register are all at a ground level. In other words, in the embodiment of FIG. 16, the power-on operation may not be required, and the gate driving circuit may enter the display phase for display driving after being started. Certainly, the embodiments of the present disclosure are not limited to this. The power-on operation may be performed by using other signal timings in the power-on phase, which will be described in further detail below.

Figure 17:
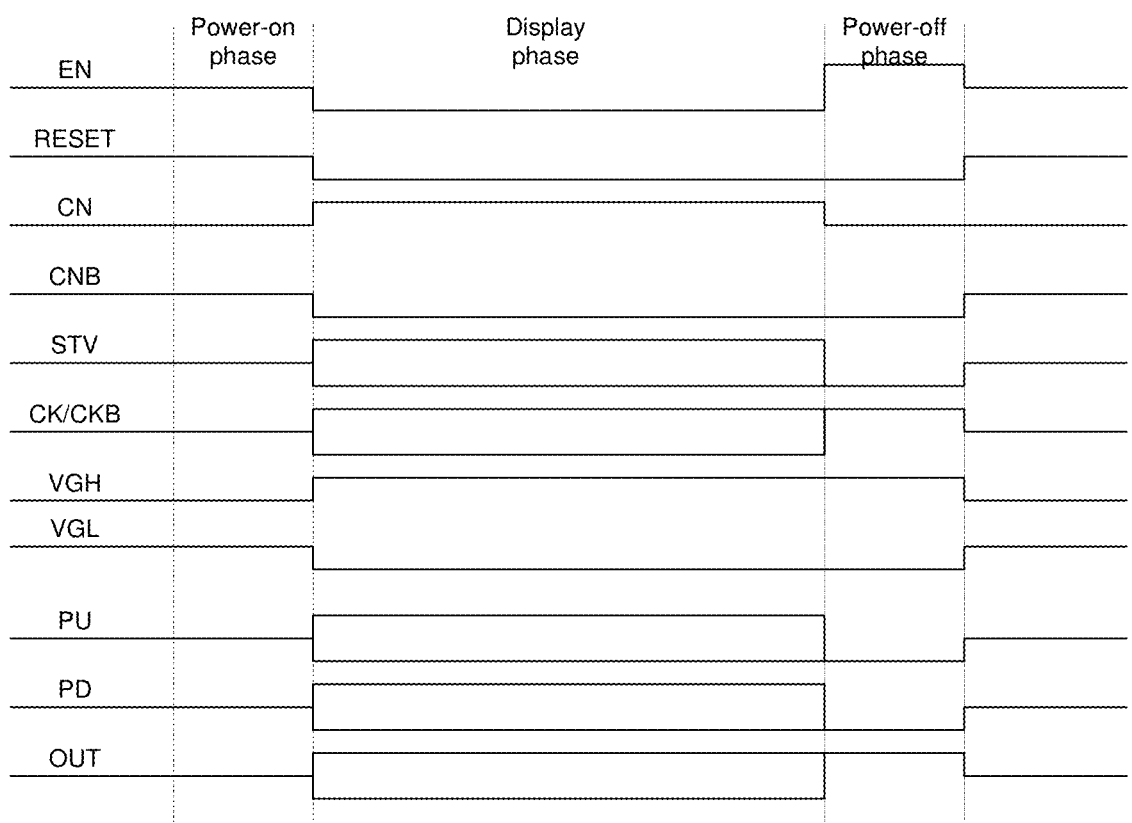
FIG. 17 shows an operation timing diagram of the gate driving circuit according to another embodiment of the present disclosure.

FIG. 17 shows an operation timing diagram of the gate driving circuit according to another embodiment of the present disclosure. A signal timing diagram of FIG. 17 is applicable to the shift register unit of any of the embodiments described above, and the shift register 400 described above is adopted in the gate driving circuit. An operation timing of FIG. 17 is similar to that of FIG. 16, and a difference lies at least in the power-off phase. In order to simplify the description, the following will mainly describe the different parts in detail.

In the display phase, similar to FIG. 16, the second control signal is at a low level, so that the second control signal terminal EN of each shift register is at a low level. Referring to FIG. 4, when the pull-down node PD is at a high level, the fifth transistor T5 is turned on, and the low level of the second control signal terminal EN is provided to the output signal terminal OUT so as to pull down the potential of the output signal terminal OUT.

In the power-off phase, the second control signal and the power signal provided to the gate driving circuit as well as the K clock signals are at a high level, so that the second control signal terminal EN, the power signal terminal VGH, the clock signal terminal CK and the first control signal terminal CKB of each shift register are respectively at a high level. Other signals (for example, the master reset signal, the input signal, the reset signal, the start signals STV1 to STVx (e.g., STV1 to STV4 in FIG. 5, or STV1 and STV2 in FIG. 6) and the reference signal) provided to the gate driving circuit are all at a low level, so that the master reset signal terminal RESET, the input signal terminal CN, the reset signal terminal CNB and the reference signal terminal VGL of each shift register are all at a low level. In each shift register, referring to FIG. 4, the high level of the first control signal terminal CKB turns on the seventh transistor T7, so that the pull-down node PD is at a high level. The high level of the pull-down node PD turns on the fifth transistor T5, so that the high level of the second control signal terminal EN is provided to the output signal terminal OUT. Since the output signal terminal OUT of each shift register outputs a high level, the cascade connection makes the input control terminal STV and the reset control terminal RST of each shift register at a high level, so as to provide the low level of the input signal terminal CN and the reset signal terminal CNB to the first pull-up node PU1. Since the power signal terminal VGH is at a high level, the tenth transistor T10 is turned on, so that the second pull-up node PU2 is also at a low level. Through the power-off process in FIG. 17, the pull-up nodes PU1 and PU2 of each shift register are at a low level, and the pull-down node PD is at a high level.

Although the specific power-on timing is described above with reference to FIG. 16 and FIG. 17, the embodiments of the present disclosure are not limited to this. Other signal timing, such as the power-on timing of FIG. 18, may be used in the power-on phase as needed.

Figure 18:
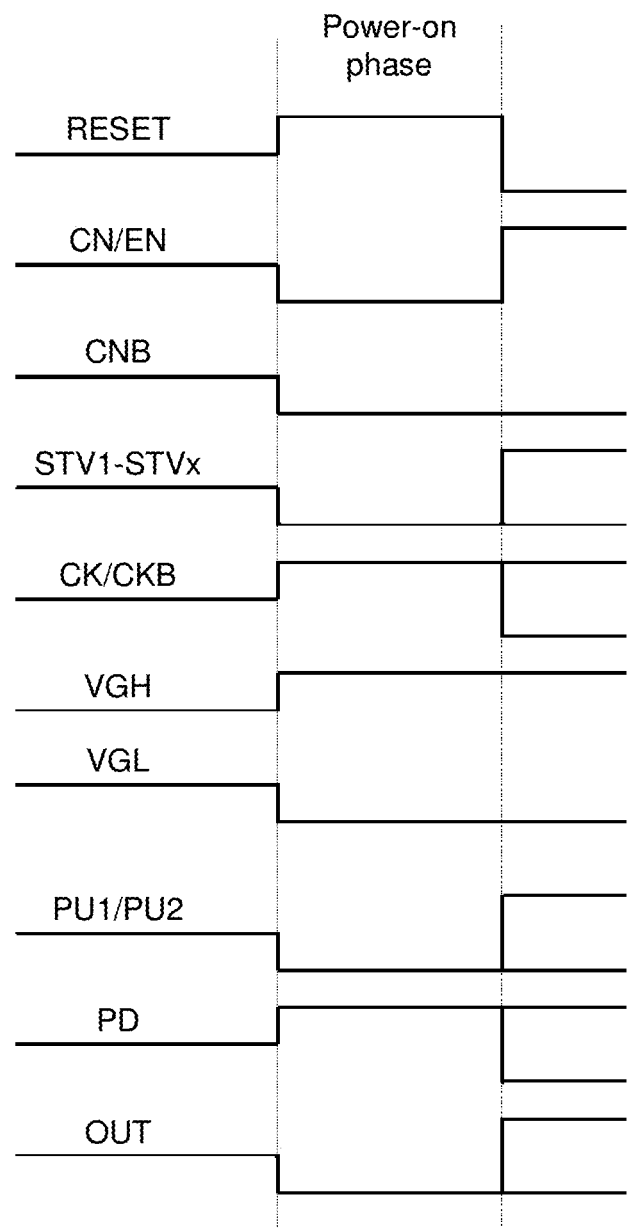
FIG. 18 shows a signal timing diagram of the gate driving circuit in a power-on phase according to another embodiment of the present disclosure.

FIG. 18 shows a signal timing diagram of the gate driving circuit in the power-on phase according to another embodiment of the present disclosure. As shown in FIG. 18, in the power-on phase, the master reset signal, the K clock signals and the power signal provided to the gate driving circuit are at a high level, so that the master reset signal terminal RESET, the clock signal terminal CK, the first control signal terminal CKB and the power signal terminal VGH of each shift register are respectively at a high level. Other signals (for example, the input signal, the second control signal, the reset signal, the start signals STV1 to STVx (x is equal to 2 or 4) and the reference signal) provided to the gate driving circuit are at a low level, so that the input signal terminal CN, the second control signal terminal EN, the reset signal terminal CNB and the reference signal terminal VGL of each shift register are at a low level. Referring to FIG. 3 and FIG. 4, the high level of the master reset signal terminal RESET turns on the fourteenth transistor T14, so as to pull down the first pull-up node PU1 to the low level of the reference signal terminal VGL. Since the power signal terminal VGH is at a high level, the tenth transistor T10 is turned on, so that the second pull-up node PU2 is also at a low level. The high level of the first control signal terminal CKB turns on the seventh transistor T7, so that the pull-down node PD is at a high level. Through the power-on process, the pull-up node may be reset to a low level, and the pull-down node may be reset to a high level, so that the pull-up node is pulled down again prior to entering the display phase, which may further mitigate the problem that the signal output in the display phase is affected due to an abnormal potential of the pull-up node.

Figure 19A:
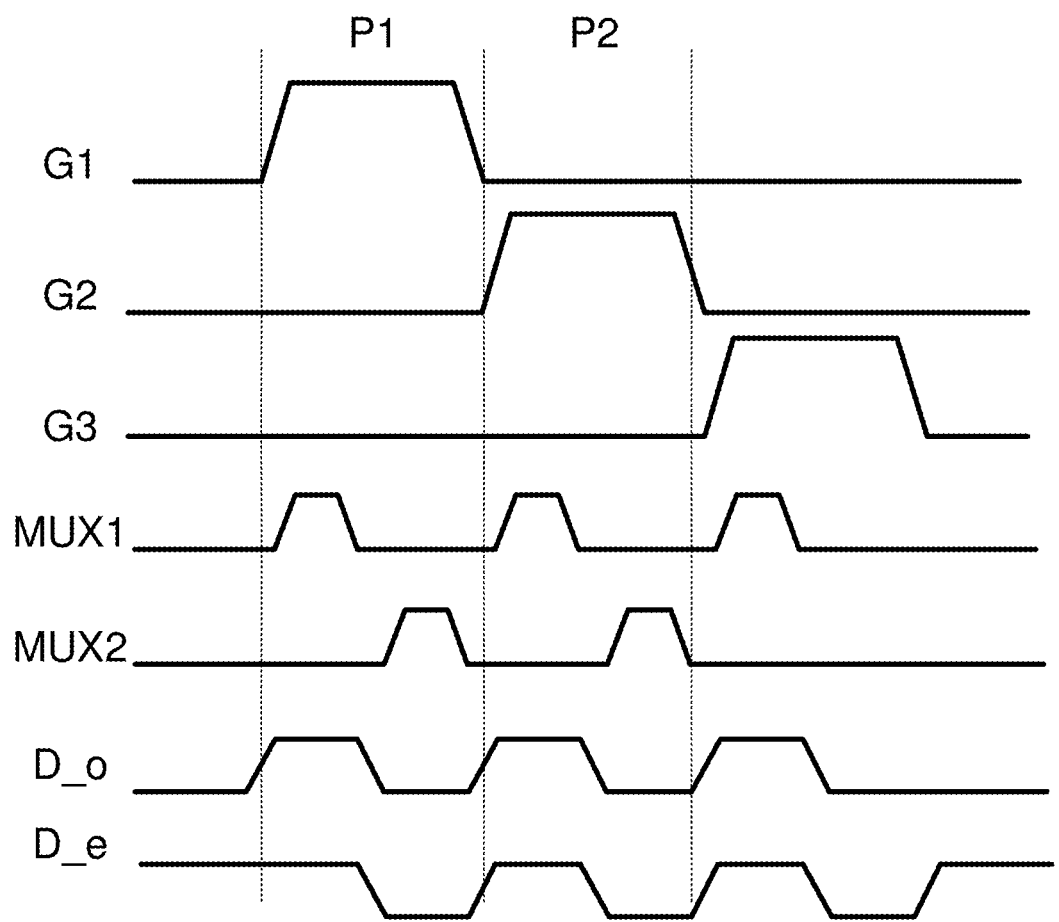
FIG. 19A shows a signal timing diagram of a display panel according to an embodiment of the present disclosure.

FIG. 19A shows a signal timing diagram of a display panel according to an embodiment of the present disclosure. A signal timing of FIG. 19 is applicable to the display panel of any of the embodiments described above, such as the display panel 1100 described above with reference to FIG. 11. The signal timing of 19A will be described below in conjunction with the display panel 1100 of FIG. 11.

Referring to FIG. 11, the gate driving circuit 1110 may provide gate driving signals to a plurality of rows of sub-pixels in the array through a plurality of gate lines G1 to GN under the control of K clock signals, so as to turn on at least one row of sub-pixels in the plurality of rows of sub-pixels. The multiplexing circuit 1130 may multiplex the received m input data signals into M output data signals under the control of the first selection signal MUX1 and the second selection signal MUX2. The M output data signals are respectively provided to the data lines D1 to DM and then to the M columns of sub-pixels in the array, so that the at least one row of sub-pixels that are turned on may emit light based on the received output data signal, where m is integer greater than 1, M is an integer greater than 1, and M is an integer multiple of m. In the embodiment of FIG. 19A, M=2m, that is, each multiplexing unit of the multiplexing circuit 1130 may multiplex one input data signal into two output data signals which are then provided to two data lines respectively.

As shown in FIG. 19A, in the period P1, the gate line G1 is at a high level, and a first row of sub-pixels is turned on. In a first sub-period of the period P1, the first selection signal line MUX1 is at a high level, and the multiplexing circuit 1130 provides the received m input data signals to m odd-numbered columns of data lines D_o (including D1, D3, D5 . . . ), so that m sub-pixels in odd-numbered columns in the first row of sub-pixels that are turned on may emit light. Then, in a second sub-period of the period P1, the high level of the second selection signal line MUX2 arrives, and the multiplexing circuit 1130 provides the received m input data signals to m even-numbered columns of data lines D_e (including D2, D4, D6 . . . ), so that m sub-pixels in even-numbered columns in the first row of sub-pixels that are turned on may emit light. In a similar manner, in the period P2, the gate line G2 of a second row of sub-pixels is at a high level, the second row of sub-pixels is turned on, and the first selection signal MUX1 and the second selection signal MUX2 are successively at a high level, so as to firstly write data to the sub-pixels in the odd-numbered columns in the second row of sub-pixels, then write data to the sub-pixels in the even-numbered columns in the second row of sub-pixels, and so on.

Figure 19B:
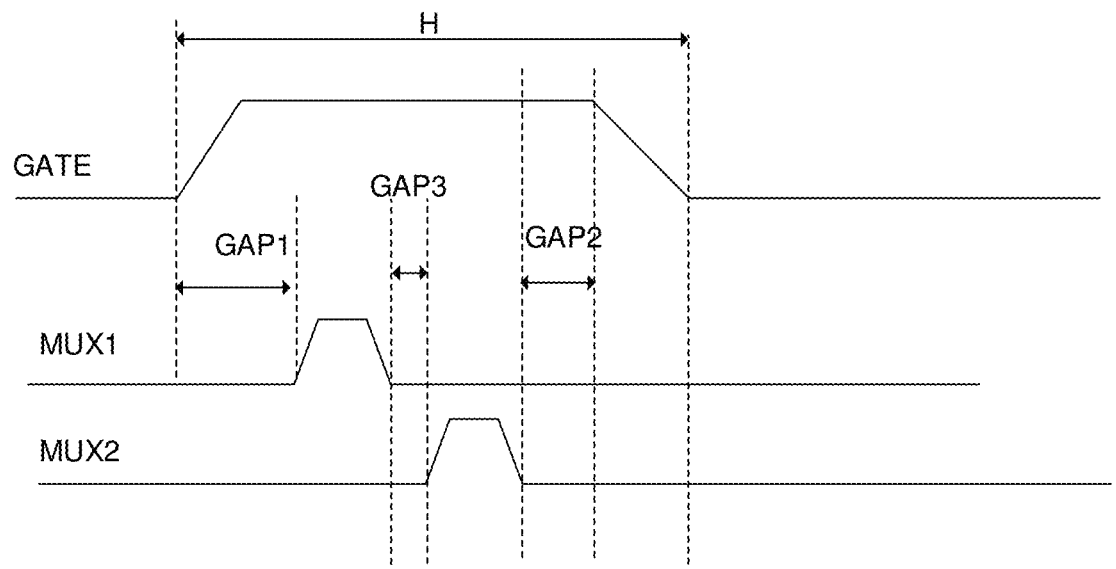
FIG. 19B shows a schematic diagram of a signal waveform of the display panel according to an embodiment of the present disclosure.

FIG. 19B shows a schematic diagram of a signal waveform of the display panel according to an embodiment of the present disclosure. As shown in FIG. 19B, under the signal timing described above with reference to FIG. 13 to FIG. 15, the gate driving signal GATE has a pulse width (that is, a time length from a start point of a rising edge of the gate driving signal GATE to an end point of a falling edge of the gate driving signal GATE) of H, and H represents the unit scanning time. The gate driving signal GATE may represent any stage gate driving signal in the gate driving circuit, for example, any one of G1 to GN described above. Within a high-level pulse of the gate driving signal GATE, there is a first time interval GAP1 between the starting point of the rising edge of the gate driving signal GATE and a starting point of a rising edge of the first selection signal MUX1, there is a second time interval GAP2 between an end point of a falling edge of the second selection signal MUX2 and a start point of the falling edge of the gate driving signal GATE, and there is a third time interval GAP3 between an end point of a falling edge of the first selection signal MUX1 and a start point of a rising edge of the second selection signal MUX2.

Generally, the longer the high level time of the first selection signal MUX1 and the second selection signal MUX2, the longer the time for charging the sub-pixels. Therefore, during the time that a row of sub-pixels are turned on, that is, during the period when the gate driving signal GATE is at a high level, it is desirable to minimize GAP1, GAP2, and a rising time Tr (the time from the start point of the rising edge to the end point of the rising edge) and a falling time Tf (the time from the start point of the falling edge to the end point of the falling edge) of the gate driving signal GATE.

Figure 19C:
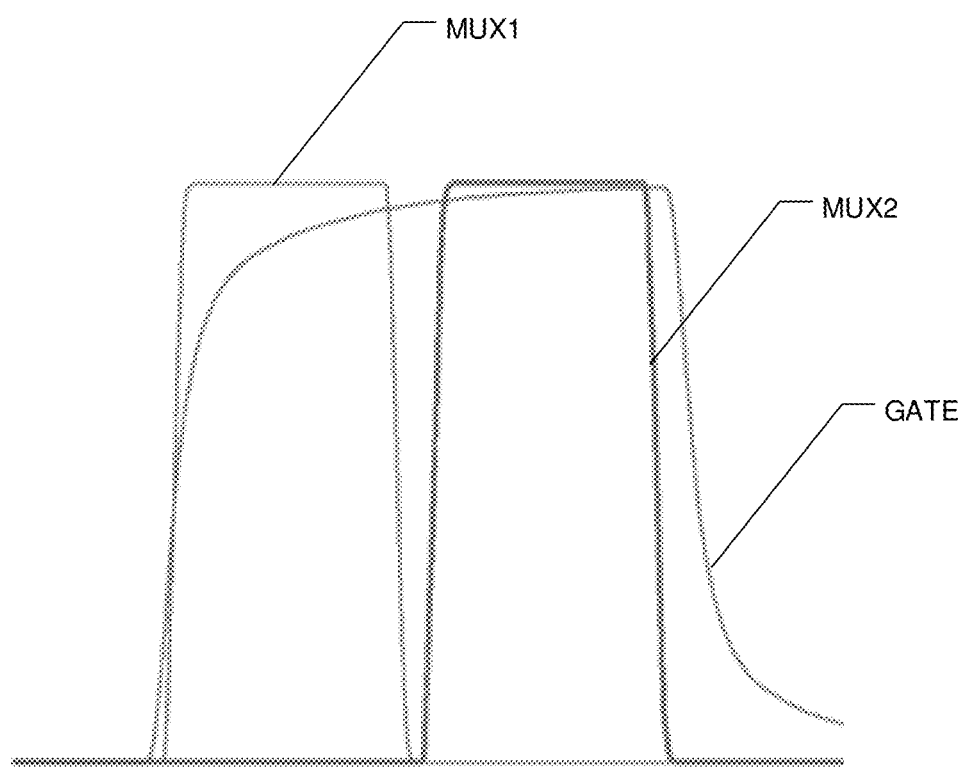
FIG. 19C shows a simulation diagram of the signal waveform of the display panel according to an embodiment of the present disclosure.

However, when the signal timing described in FIG. 13 to FIG. 15 is adopted, as shown in the signal simulation diagram of FIG. 19C, the rising time Tr of the gate driving signal GATE is long, so that the gate driving signal GATE has not reached the desired high level within a certain period of time after the first selection signal MUX1 changes to a high level, which results in incomplete turn-on of the sub-pixels. This makes a charging rate of the sub-pixel corresponding to the first selection signal MUX1 lower than a charging rate of the sub-pixel corresponding to the second selection signal MUX2. The so-called charging rate is a ratio of a data voltage actually achieved by the sub-pixel to a desired data voltage.

Figure 20:
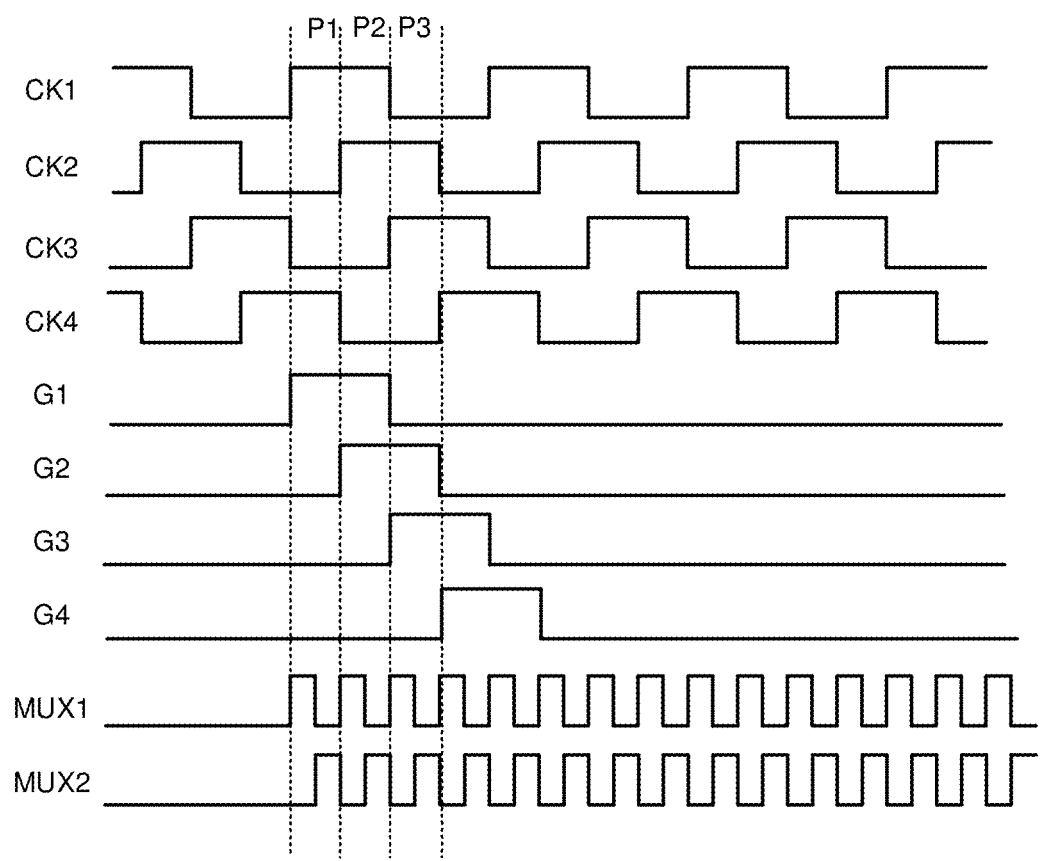
FIG. 20 shows a signal timing diagram of the display panel according to another embodiment of the present disclosure.

FIG. 20 shows a signal timing diagram of the display panel according to another embodiment of the present disclosure. The signal timing diagram of FIG. 20 is applicable to the gate driving circuit using four clock signals described above, such as the gate driving circuit 600. The signal timing of FIG. 20 is similar to that of FIG. 15. The difference lies at least in that the four clock signals CK1 to CK4 are periodic signals with a duty ratio of 50% and a pulse width of 2H. The first selection signal MUX1 and the second selection signal MUX2 are periodic signals with a duty ratio of 50% and a pulse width less than m/M*H. In this embodiment, M=2m, and each of the pulse width of the first selection signal MUX1 and the pulse width of the second selection signal MUX2 is less than ½*H.

In the period P1, the gate driving signal G1 is at a high level, and the first row of sub-pixels are turned on. This process is also referred to as a pre-charging phase.

In the period P2, the gate driving circuit G1 is maintained at a high level, and the first selection signal MUX1 and the second selection signal MUX2 successively change to a high level, so as to write the data signal for the first row to the first row of sub-pixels that are turned on. In the period P2, the gate driving circuit G2 is also at a high level to pre-charge the second row of sub-pixels. During this period, the high level of the first selection signal MUX1 and the high level of the second selection signal MUX2 cause the data signal for the first row to be written to the second row of sub pixels. However, the pre-charging process may not cause a substantive influence on a normal display of the second row of sub-pixels, because in the period P3 following the period P2, the data signal for the second row may be written to the second row of sub-pixels in a similar manner as described above.

Through the pre-charging described above, the high-level duration of the gate driving signal is increased, so that the charging rate of the sub-pixel corresponding to the first selection signal MUX1 is consistent with the charging rate of the sub-pixel corresponding to the second selection signal MUX2. However, for a larger-size and higher-resolution product, such as 31.5 8K product, the pre-charging scheme described above may have some problems, which will be analyzed and explained below with reference to FIG. 21A to FIG. 21C.

Figure 21A:
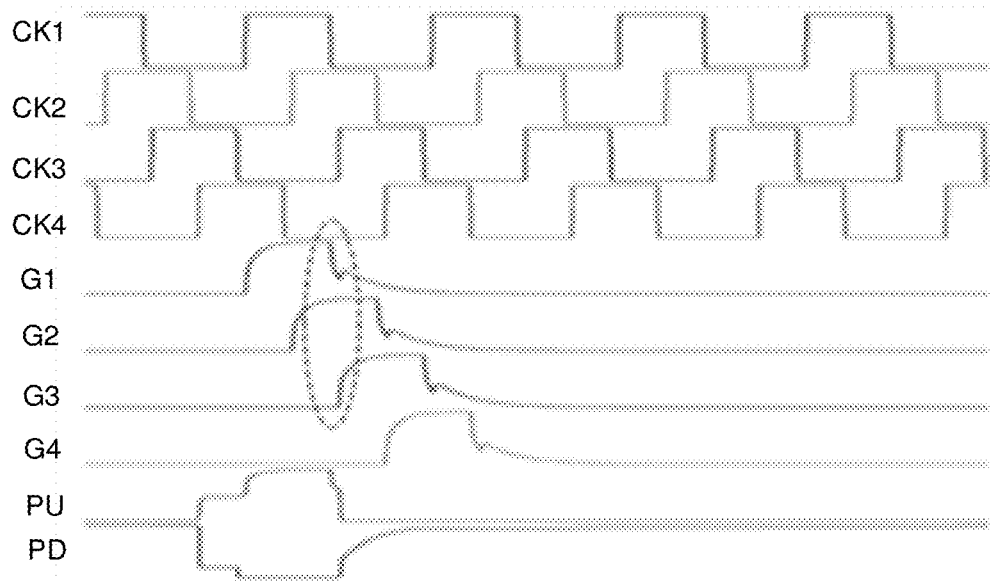
FIG. 21A to FIG. 21C show signal simulation diagrams of the embodiment of FIG. 20.
Figure 21B:
Figure 21C:
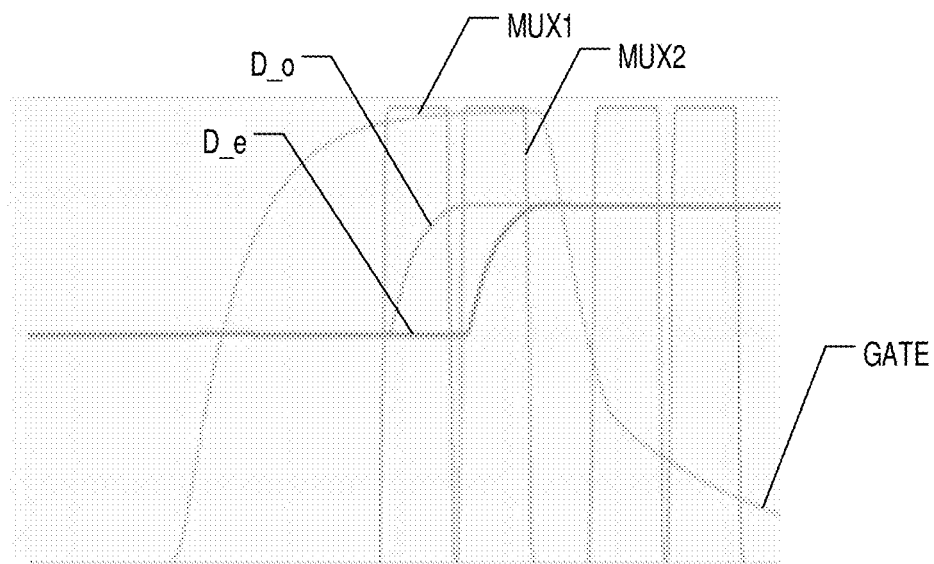

FIG. 21A to FIG. 21C show signal simulation diagrams of the embodiment of FIG. 20.

With reference to the structure of the gate driving circuit 600, when the output signal terminal OUT of the third stage shift register GOA3 is at a high level, the pull-up node PU of the first stage shift register GOA1 is discharged, so that the third transistors T3 of the first stage shift register GOA1 is turned off. At the same time, the CKB of the first stage shift register GOA1 charges the pull-down node PD, so that the fourth transistor T4 is turned on. In the first stage shift register GOA1, when the third transistor T3 has been turned off but the fourth transistor T4 has not yet been turned on, the output signal terminal OUT is in a floating state. At this time, the potential of the output signal terminal OUT rises due to a coupling capacitance with the pull-down node PD, as shown by a dashed line in FIG. 21A. In the first stage shift register GOA1, after the fourth transistor T4 is turned on, the potential of the output signal terminal OUT continues to decrease. Because the channel width-to-length ratio W/L of the fourth transistor T4 is small, the discharge capacity is weak, so that the discharge time of the output signal terminal OUT is long, and the falling time Tf of the gate drive signal G1 generated is long, as shown in FIG. 21A.

In addition, for an 8K display panel with a resolution of 7680×4320, if the cascade scheme of four clock signals in FIG. 6 is adopted, each clock signal may drive 1080 rows of pixels. In this case, as shown in the charging simulation waveform of FIG. 21B, in a plurality of shift registers controlled by the same clock signal line (for example, the clock signal line that provides the clock signal CK1), there is a great difference between the rising edge of the gate driving signal on the gate line of the shift register far from the clock signal line (for example, the gate line Gx connected to the output signal terminal of the last stage shift register controlled by CK1) and the rising edge of the gate driving signal on the gate line of the shift register close to the clock signal line (for example, the gate line G1 connected to the output signal terminal of the first stage shift register controlled by CK1). If a process fluctuation of signal line width and signal line material film thickness in process leads to a large fluctuation of RC load on the gate line, the difference may be greater, and even lead to split screen and abnormal display of the product.

As shown in the simulation waveform diagram of FIG. 21C, for the 8K display product, the charging rate of the sub-pixels achieved in the driving scheme of FIG. 20 is less than 95%.

Figure 22:
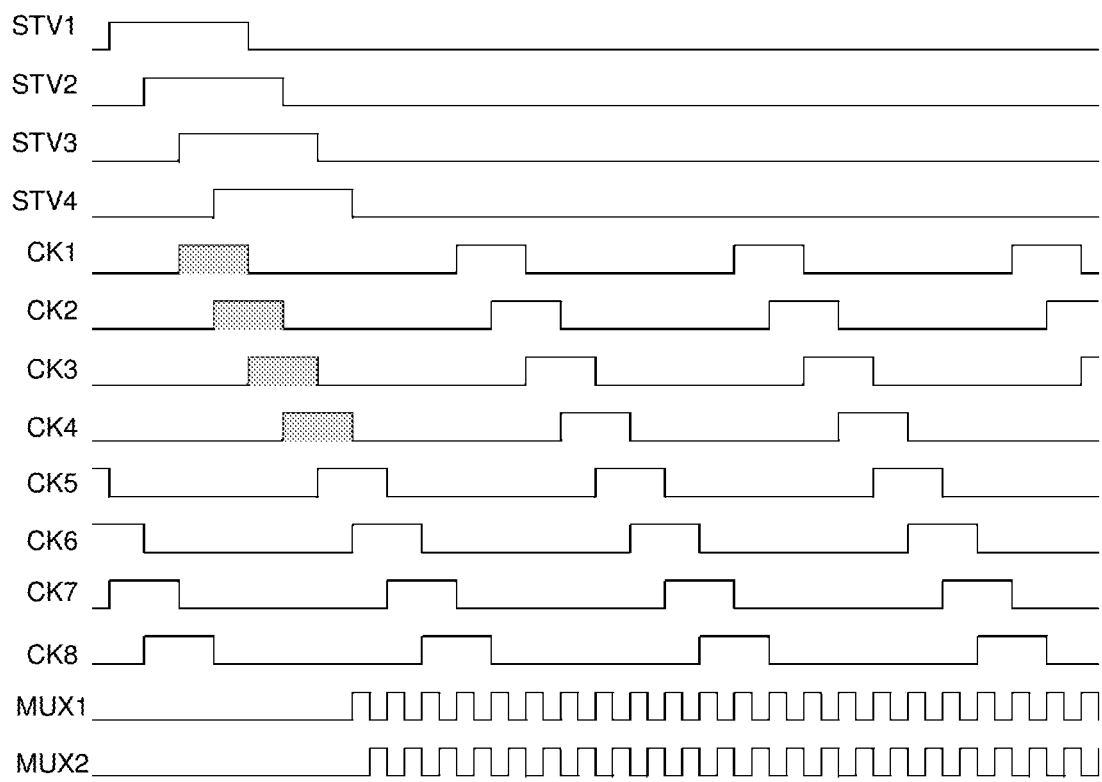
FIG. 22 shows a signal waveform diagram of the display panel according to another embodiment of the present disclosure.

FIG. 22 shows a signal waveform diagram of the display panel according to another embodiment of the present disclosure. The signal timing diagram of FIG. 22 is applicable to the gate driving circuit using eight clock signals described above, such as the gate driving circuit 600. The signal timing of FIG. 22 is similar to that of FIG. 20, and the difference lies at least in that the eight clock signals are periodic signals with a duty ratio of 25% and a pulse width of 2H. The first selection signal MUX1 and the second selection signal MUX2 are periodic signals with a duty ratio of 50% and a pulse width less than ½*H.

Figure 23A:
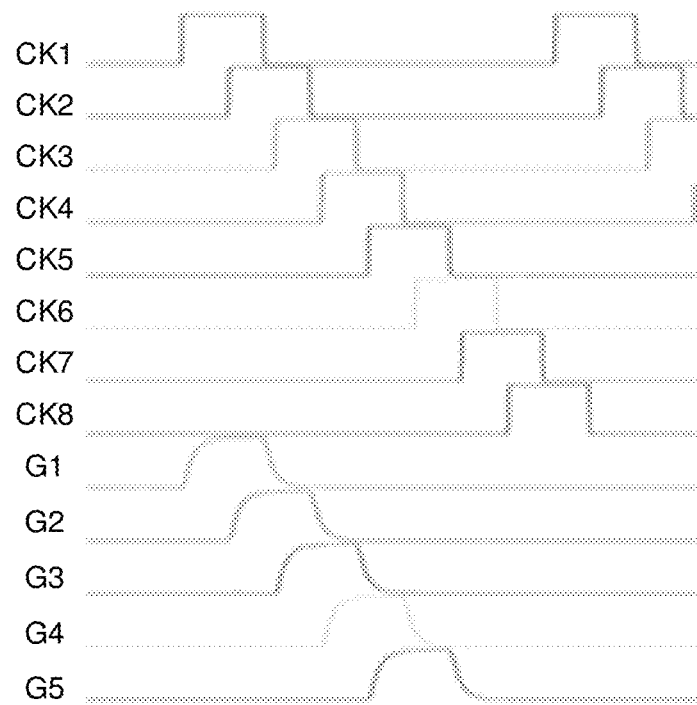
Figure 23B:
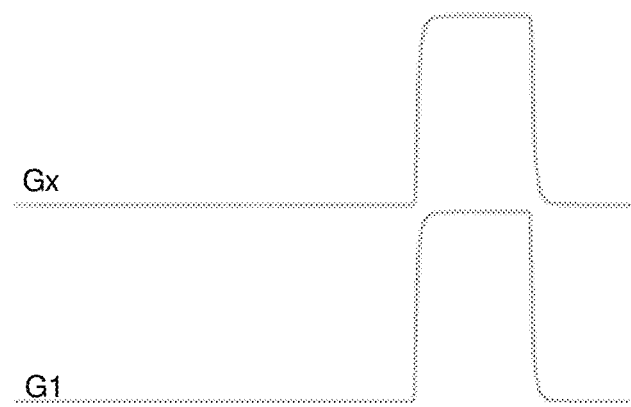

FIG. 23A to FIG. 23C show signal simulation diagrams of the embodiment of FIG. 22. As shown in FIG. 23A, by adopting the cascade scheme of eight clock signals of FIG. 5, the falling edge of the gate driving signal G1 controlled by the clock signal CK1 and the rising edge of the gate driving signal G5 controlled by the clock signal CK5 do not overlap, and the falling time Tf of the gate driving signals G1 to GN is smaller than that in FIG. 21A. As shown in FIG. 23B, for the 8K display product described above, if the cascade scheme of eight clock signals is adopted, each clock signal may drive 540 rows of pixels. Compared with FIG. 21B, the difference between the rising edges of the gate driving signals on different gate lines (such as G1 and Gx) controlled by the same clock signal line is reduced. As shown in FIG. 23C, by using the driving method of FIG. 22, the sub-pixel charging rate may reach 96%.

The signal waveforms described above with reference to FIG. 19A to FIG. 23 are the signal waveforms of the display panel in the display phase. The signal waveforms of the display panel in the power-on phase and the power-off phase may be selected as needed. For example, the power-on timing and the power-off timing in any of the embodiments described with reference to FIG. 16 to FIG. 18 may be used.

FIG. 24 shows a flowchart of a method of driving a gate driving circuit according to some embodiments of the present disclosure. The method is applicable to the gate driving circuit of any of the embodiments described above.

In step S2401, in the display phase, an input signal at a first level is provided to the gate driving circuit, so that each shift register outputs a gate driving signal at the output signal terminal of the shift register based on the input signal under the control of a potential of the input control terminal STV of the shift register.

In step S2402, in the power-off phase, a second control signal at the first level and an input signal at a second level are provided to the gate driving circuit, so that each shift register provides the second control signal at the first level to the output signal terminal OUT of the shift register, and each shift register provides the input signal at the second level to the pull-up node PU of the shift register under the control of the potential of the input control terminal STV of the shift register.

For example, in a case that the second control circuit of each shift register includes a pull-down sub-circuit and a lower electronic circuit, for example, in a case of using the shift register 300, in the display phase, the pull-down sub-circuit of each shift register provides the potential of the reference signal terminal VGL of the shift register to the output signal terminal OUT of the shift register under the control of the potential of the pull-down node PD of the shift register; in the power-off phase, the lower electronic circuit of each shift register provides the second control signal at the first level at the second control signal terminal EN of the shift register to the output signal terminal OUT of the shift register, and provides the potential of the reference signal terminal VGL of the shift register to the pull-down node PD of the shift register.

For example, in a case that the second control circuit of each shift register includes the fifth transistor T5 and the second capacitor C2, for example, in a case of using the shift register 400, in the display phase, the second control signal at the second level is provided to the gate driving circuit, so that the second control circuit of each shift register provides the second control signal at the second level to the output signal terminal OUT of the shift register under the control of the potential of the pull-down node PD of the shift register; in the power-off phase, K clock signals maintained at the first level are provided to the gate driving circuit, so that the first control circuit of each shift register provides a received clock signal at the first level at the first control signal terminal CKB of the shift register to the pull-down node PD of the shift register, and the potential of the pull-down node PD enables the second control circuit of the shift register to provide the second control signal at the first level to the output signal terminal OUT of the shift register.

In some embodiments, in the display phase, K clock signals shifted sequentially are provided to the gate driving circuit, so that each shift register outputs the gate driving signal at the output signal terminal OUT of the shift register based on the input signal and a received clock signal under the control of the potential of the input control terminal STV of the shift register. The k+1th clock signal is shifted by a unit scanning time with respect to the kth clock signal, where k is an integer, 1≤k≤K−1. The unit scanning time is a time for scanning a row of pixels by the gate driving circuit.

Those skilled in the art may understand that the embodiments described above are exemplary, and those skilled in the art may make improvements. The structures described in the embodiments may be combined freely without conflicts in structure or principle.

After describing the preferred embodiments of the present disclosure in detail, those skilled in the art may clearly understand that various changes and modifications may be made without departing from the scope and spirit of the appended claims, and the present disclosure is not limited to implementations of the exemplary embodiments described in the present disclosure.

What is claimed is:

1. A shift register, comprising:
an input circuit connected to an input signal terminal, an input control terminal, and a pull-up node of the shift register, wherein the input circuit is configured to input a potential of the input signal terminal to the pull-up node under the control of a signal of the input control terminal;
an output circuit connected to the pull-up node, a clock signal terminal, and an output signal terminal, wherein the output circuit is configured to provide a signal of the clock signal terminal to the output signal terminal under the control of a potential of the pull-up node;
a first control circuit connected to a first control signal terminal, the pull-up node, a pull-down node of the shift register, and a reference signal terminal, wherein the first control circuit is configured to provide a potential of the first control signal terminal to the pull-down node, and provide a potential of the reference signal terminal to the pull-down node according to the potential of the pull-up node;
a second control circuit connected to the pull-down node, a second control signal terminal, the output signal terminal, and the reference signal terminal, wherein the second control circuit is configured to pull down a potential of the output signal terminal in a display phase under the control of a potential of the pull-down node and a potential of the second control signal terminal, and pull up the potential of the output signal terminal in a power-off phase; and
a master reset circuit connected to a master reset signal terminal, the pull-up node, and the reference signal terminal,
wherein the second control circuit comprises:
a pull-down sub-circuit connected to the pull-down node, the output signal terminal, and the reference signal terminal, wherein the pull-down sub-circuit is configured to provide the potential of the reference signal terminal to the output signal terminal under the control of the potential of the pull-down node; and
a lower electronic circuit connected to the second control signal terminal, the pull-down node, the output signal terminal, and the reference signal terminal, wherein the lower electronic circuit is configured to, under the control of a signal of the second control signal terminal, provide the potential of the second control signal terminal to the output signal terminal and provide the potential of the reference signal terminal to the pull-down node,
wherein the pull-down sub-circuit comprises:
a third transistor having a gate electrode connected to the pull-down node, a first electrode connected to the reference signal terminal, and a second electrode connected to the output signal terminal;
a first capacitor having a first terminal connected to the pull-down node, and a second terminal connected to the reference signal terminal; and
a fourth transistor having a gate electrode connected to the output signal terminal, a first electrode connected to the reference signal terminal, and a second electrode connected to the pull-down node;

wherein:
in a power-on phase,
the master reset signal terminal is at a first level, the reference signal terminal is at a second level, the first level of the master reset signal terminal causes the master reset circuit to provide the second level of the reference signal terminal to the pull-up node, so as to reset the pull-up node; and
in the power-off phase,
the input control terminal is at a first level, the input signal terminal is at a second level, the reference signal terminal is at a second level, and the second control signal terminal is at a first level;
the first level of the input control terminal causes the input circuit to input the second level of the input signal terminal to the pull-up node;
the first level of the second control signal terminal causes the first transistor and the second transistor to be turned on, such that the first transistor provides the first level of the second control terminal to the output signal terminal, and the second transistor provides the second level of the reference signal terminal to the pull-down node; and
the first level of the output signal terminal causes the fourth transistor to be turned on, such that fourth transistor provides the second level of the reference signal terminal to the pull-down node, and the second level of the pull-down node causes the third transistor to be turned off.

2. The shift register of claim 1, wherein the lower electronic circuit comprises:
a first transistor having a gate electrode and a first electrode connected to the second control signal terminal, and a second electrode connected to the output signal terminal; and
a second transistor having a gate electrode connected to the second control signal terminal, a first electrode connected to the reference signal terminal, and a second electrode connected to the pull-down node.

3. The shift register of claim 1, wherein the second control circuit comprises:
a fifth transistor having a gate electrode connected to the pull-down node, a first electrode connected to the second control signal terminal, and a second electrode connected to the output signal terminal; and
a second capacitor having a first terminal connected to the pull-down node, and a second terminal connected to the reference signal terminal.

4. The shift register of claim 1, wherein the pull-up node comprises a first pull-up node connected to the input circuit and a second pull-up node connected to the output circuit, and the first control circuit comprises:
a seventh transistor having a gate electrode and a first electrode connected to the first control signal terminal, and a second electrode connected to the pull-down node;
an eighth transistor having a gate electrode connected to the pull-down node, a first electrode connected to the reference signal terminal, and a second electrode connected to the first pull-up node;
a ninth transistor having a gate electrode connected to the first pull-up node, a first electrode connected to the reference signal terminal, and a second electrode connected to the pull-down node; and a tenth transistor having a gate electrode connected to a power signal terminal, a first electrode connected to the first pull-up node, and a second electrode connected to the second pull-up node.

5. A gate driving circuit comprising N-stage cascaded shift registers, wherein each shift register of the N-stage cascaded shift registers is the shift register claim 1, and wherein,
each shift register has an input signal terminal connected to receive an input signal, a reset signal terminal connected to receive a reset signal, and a second control signal terminal connected to receive a second control signal;
an nth stage shift register has an input control terminal connected to an output signal terminal of an (n−i)th stage shift register, and a reset control terminal connected to an output signal terminal of an (n+j)th stage shift register; and
the N-stage cascaded shift registers are divided into at least one group, each group of the at least one group comprises K-stage cascaded shift registers having clock signal terminals respectively connected to receive K clock signals and first control signal terminals respectively connected to receive the K clock signals, where each of N, K, n, i and j is an integer, $1 \leq n \leq N$, $1 < K \leq N$.

6. The gate driving circuit of claim 5, wherein $i=j=4$, $K=8$, the K clock signals comprise a first clock signal, a second clock signal, a third clock signal, a fourth clock signal, a fifth clock signal, a sixth clock signal, a seventh clock signal and an eighth clock signal, and each group of shift registers comprises:
a first stage shift register having a clock signal terminal connected to receive the first clock signal, and a first control signal terminal connected to receive the fifth clock signal;
a second stage shift register having a clock signal terminal connected to receive the second clock signal, and a first control signal terminal connected to receive the sixth clock signal;
a third stage shift register having a clock signal terminal connected to receive the third clock signal, and a first control signal terminal connected to receive the seventh clock signal;
a fourth stage shift register having a clock signal terminal connected to receive the fourth clock signal, and a first control signal terminal connected to receive the eighth clock signal;
a fifth stage shift register having a clock signal terminal connected to receive the fifth clock signal, and a first control signal terminal connected to receive the first clock signal;
a sixth stage shift register having a clock signal terminal connected to receive the sixth clock signal, and a first control signal terminal connected to receive the second clock signal;
a seventh stage shift register having a clock signal terminal connected to receive the seventh clock signal, and a first control signal terminal connected to receive the third clock signal; and
an eighth stage shift register having a clock signal terminal connected to receive the eighth clock signal, and a first control signal terminal connected to receive the fourth clock signal.

7. The gate driving circuit of claim 5, wherein $i=j=2$, $K=4$, the K clock signals comprise a first clock signal, a second clock signal, a third clock signal, and a fourth clock signal, and each group of shift registers comprises:
- a first stage shift register having a clock signal terminal connected to receive the first clock signal, and a first control signal terminal connected to receive the third clock signal;
- a second stage shift register having a clock signal terminal connected to receive the second clock signal, and a first control signal terminal connected to receive the fourth clock signal;
- a third stage shift register having a clock signal terminal connected to receive the third clock signal, and a first control signal terminal connected to receive the first clock signal; and
- a fourth stage shift register having a clock signal terminal connected to receive the fourth clock signal, and a first control signal terminal connected to receive the second clock signal.

8. A display panel, comprising:
- a plurality of sub-pixels arranged in an array; and
- at least one gate driving circuit of claim 5, wherein the N-stage cascaded shift registers in the gate driving circuit are respectively connected to a plurality of rows of sub-pixels in the array.

9. The display panel of claim 8, wherein the display panel comprises two gate driving circuits respectively located on both sides of the array of the plurality of sub-pixels in a first direction, and the first direction is a row direction of the array.

10. The display panel of claim 8, wherein the display panel comprises one gate driving circuit, where i=j=2, K=4, and odd-numbered stage shift registers and even-numbered stage shift registers in the gate driving circuit are respectively located on both sides of the array of the plurality of sub-pixels in the first direction.

11. The display panel of claim 8, wherein the shift register comprises an input circuit, a first control circuit, a second control circuit, and an output circuit sequentially arranged in the first direction, each of a size of the input circuit in a second direction, a size of the first control circuit in the second direction, a size of the second control circuit in the second direction, and a size of the output circuit in the second direction is 0.8 to 1.4 times a size of the sub-pixel in the second direction, the first direction is a row direction of the array, and the second direction is perpendicular to the first direction.

12. The display panel of claim 8, further comprising:
- a multiplexing circuit connected to M columns of sub-pixels in the array, wherein the multiplexing circuit is configured to multiplex m input data signals received into M output data signals under the control of a first selection signal and a second selection signal and provide the M output data signals to the M columns of sub-pixels respectively, where m is an integer greater than 1, M is an integer greater than 1, and M is an integer multiple of m.

13. A method of driving the gate driving circuit of claim 5, comprising:
- in a display phase, providing an input signal at a first level to the gate driving circuit, so that each shift register outputs a gate driving signal at an output signal terminal of the shift register based on the input signal under the control of a potential of an input control terminal of the shift register; and
- in a power-off phase, providing a second control signal at a first level and an input signal at a second level to the gate driving circuit, so that each shift register provides the second control signal at the first level to the output signal terminal of the shift register, and each shift register provides the input signal at the second level to a pull-up node of the shift register under the control of the potential of the input control terminal of the shift register.

14. The method of claim 13, wherein the second control circuit of each shift register comprises a pull-down sub-circuit and a lower electronic circuit, and wherein,
- in the display phase, the pull-down sub-circuit of each shift register provides a potential of a reference signal terminal of the shift register to an output signal terminal of the shift register under the control of a potential of a pull-down node of the shift register; and
- in the power-off phase, the lower electronic circuit of each shift register provides the second control signal at the first level at the second control signal terminal of the shift register to the output signal terminal of the shift register, and provide the potential of the reference signal terminal of the shift register to the pull-down node of the shift register.

15. The method of claim 13, wherein the second control circuit of each shift register comprises a fifth transistor and a second capacitor, and the method further comprises:
- in the display phase, providing the second control signal at the second level to the gate driving circuit, so that the second control circuit of each shift register provides the second control signal at the second level to the output signal terminal of the shift register under the control of the potential of the pull-down node of the shift register; and
- in the power-off phase, providing K clock signals maintained at the first level to the gate driving circuit, so that the first control circuit of each shift register provides a clock signal at the first level received at the first control signal terminal of the shift register to the pull-down node of the shift register, and a potential of the pull-down node enables the second control circuit of the shift register to provide the second control signal at the first level to the output signal terminal of the shift register.

16. The method of claim 13, further comprising:
- in the display phase, providing K clock signals shifted sequentially to the gate driving circuit, so that each shift register outputs the gate driving signal at the output signal terminal of the shift register based on the input signal and a received clock signal under the control of the potential of the input control terminal of the shift register, wherein a (k+1)th clock signal is shifted by a unit scanning time with respect to a kth clock signal, where k is an integer, $1 \leq k \leq K-1$, and the unit scanning time is a time for scanning a row of pixels by the gate driving circuit.

17. The method of claim 16, wherein:
- i=j=4 and K=8 in the gate driving circuit, and wherein:
  - in the display phase, the K clock signals are periodic signals with a duty ratio of 25% and a pulse width of 2 times the unit scanning time, or
  - in the display phase, the K clock signals are periodic signals with a duty ratio of 12.5% and a pulse width equal to the unit scanning time; or
- i=j=2 and K=4 in the gate driving circuit, and wherein:
  - in the display phase, the K clock signals are periodic signals with a duty ratio of 50% and a pulse width of 2 times the unit scanning time; or in the display phase, the K clock signals are periodic signals with a duty ratio of 25% and a pulse width equal to the unit scanning time.

* * * * *